United States Patent
More et al.

(10) Patent No.: US 12,308,366 B2
(45) Date of Patent: May 20, 2025

(54) METHOD OF MANUFACTURING SEMICONDUCTOR DEVICES AND SEMICONDUCTOR DEVICES

(71) Applicant: TAIWAN SEMICONDUCTOR MANUFACTURING CO., LTD., Hsinchu (TW)

(72) Inventors: Shahaji B. More, Hsinchu (TW); Chandrashekhar Prakash Savant, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/097,073

(22) Filed: Jan. 13, 2023

(65) Prior Publication Data

US 2023/0154979 A1 May 18, 2023

Related U.S. Application Data

(62) Division of application No. 17/104,019, filed on Nov. 25, 2020, now Pat. No. 11,557,649.

(Continued)

(51) Int. Cl.
*H01L 27/092* (2006.01)
*H01L 21/8238* (2006.01)
(Continued)

(52) U.S. Cl.
CPC .. *H01L 29/0638* (2013.01); *H01L 21/823821* (2013.01); *H01L 21/823857* (2013.01);
(Continued)

(58) Field of Classification Search
CPC ......... H01L 27/0924; H01L 21/823821; H01L 21/823857; H01L 29/517; H01L 21/823842; H01L 27/0207; H01L 27/092; H01L 29/0638; H01L 29/4236; H01L 29/42364; H01L 29/66795; H01L 29/785; H01L 27/1104; H01L 29/4966;
(Continued)

(56) References Cited

U.S. PATENT DOCUMENTS

| 9,330,938 B2 | 5/2016 | Ando et al. |
| 10,276,676 B1 * | 4/2019 | Liang .................. H01L 29/7856 |

(Continued)

FOREIGN PATENT DOCUMENTS

| CN | 104810368 A | 7/2015 |
| CN | 110379713 A | 10/2019 |

(Continued)

OTHER PUBLICATIONS

Notice of Allowance issued in U.S. Appl. No. 17/104,019, dated Sep. 15, 2022.

*Primary Examiner* — Cuong B Nguyen
(74) *Attorney, Agent, or Firm* — STUDEBAKER & BRACKETT PC

(57) ABSTRACT

A gate structure of a field effect transistor includes a first gate dielectric layer, a second gate dielectric layer, and one or more conductive layers disposed over the first gate dielectric layer and the second gate dielectric layer. The first gate dielectric layer is separated from the second gate dielectric layer by a gap filled with a diffusion blocking layer.

20 Claims, 25 Drawing Sheets

Related U.S. Application Data

(60) Provisional application No. 63/045,433, filed on Jun. 29, 2020.

(51) Int. Cl.
| | |
|---|---|
| *H01L 29/06* | (2006.01) |
| *H01L 29/423* | (2006.01) |
| *H01L 29/66* | (2006.01) |
| *H01L 29/78* | (2006.01) |

(52) U.S. Cl.
CPC ...... *H01L 27/0924* (2013.01); *H01L 29/4236* (2013.01); *H01L 29/42364* (2013.01); *H01L 29/66795* (2013.01); *H01L 29/785* (2013.01)

(58) Field of Classification Search
CPC .......... H01L 29/0673; H01L 29/42392; H01L 29/775; H01L 29/4232; B82Y 10/00
See application file for complete search history.

(56) References Cited

U.S. PATENT DOCUMENTS

| | | | |
|---|---|---|---|
| 10,510,836 B1 | 12/2019 | Haase et al. | |
| 10,573,563 B2 | 2/2020 | Li | |
| 11,121,041 B2 | 9/2021 | Chen et al. | |
| 11,158,719 B2 | 10/2021 | Lee et al. | |
| 2018/0211955 A1* | 7/2018 | Greene | ........... H01L 21/823437 |
| 2019/0318967 A1 | 10/2019 | Chen et al. | |

FOREIGN PATENT DOCUMENTS

| | | |
|---|---|---|
| CN | 110828561 A | 2/2020 |
| CN | 111261522 A | 6/2020 |

\* cited by examiner

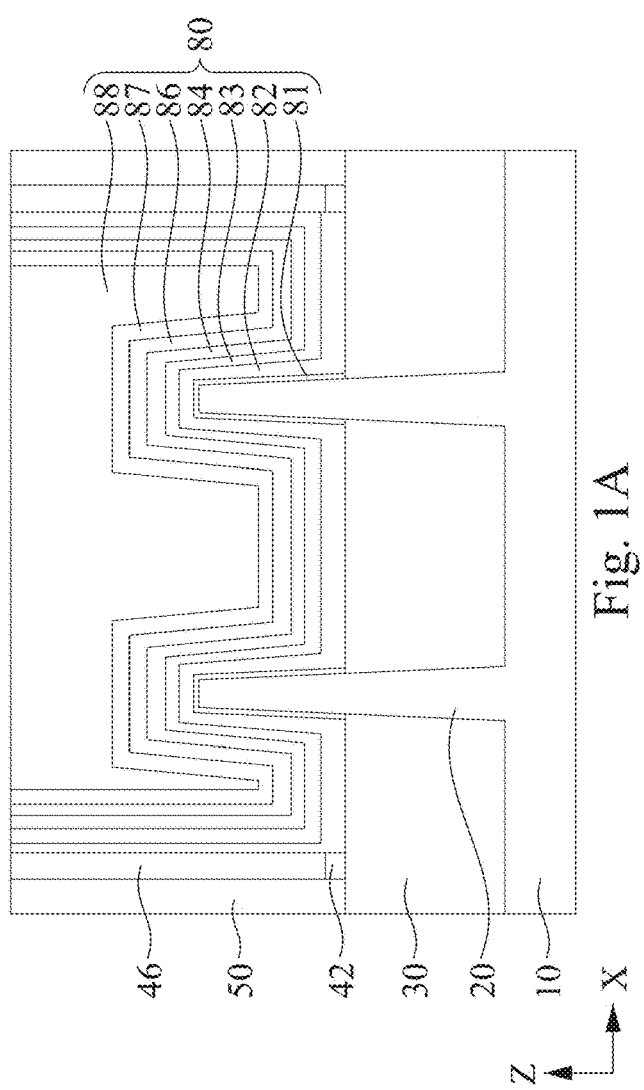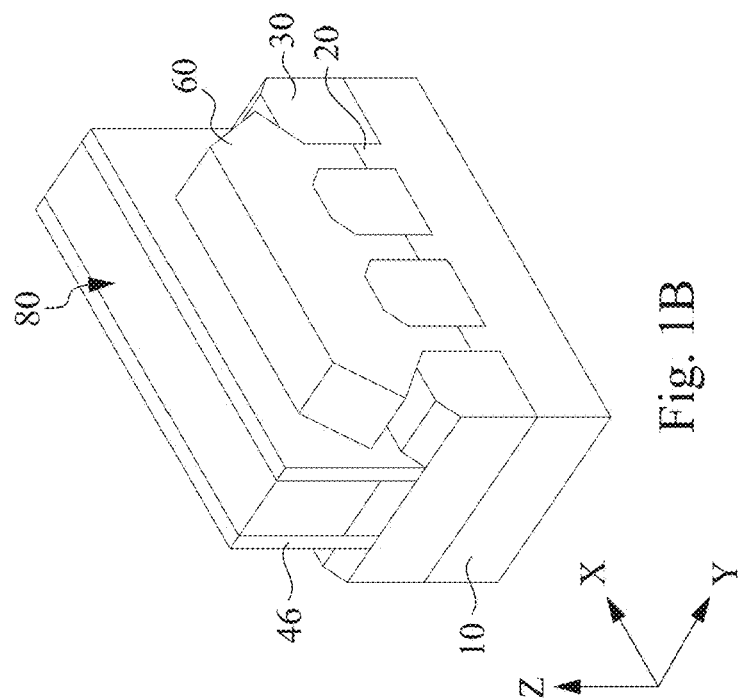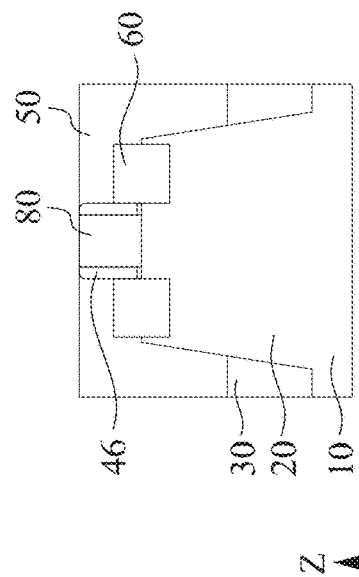

Fig. 4A

| N1 (WF1) | N2 (WF2) | N3 (WF3) | P3 (WF1) | P2 (WF2) | P1 (WF3) |
|---|---|---|---|---|---|
| 100 | 100 | 100 | 100 | 100 | 100 |
|  | 89-2 | 89-2 |  |  | 89-2 |
|  |  | 89-1 |  | 89-2 | 89-1 |
| 82 | 82 | 82 | 82 | 82 | 82 |
| 81N | 81N | 81N | 81P | 81P | 81P |
| 10N | 10N | 10N | 10P | 10P | 10P |

Fig. 4B

|  | U-Low voltage | Low voltage | Standard voltage |
|---|---|---|---|
| NFET (Si Channel) | WF1 | WF2 | WF3 |
| PFET (SiGe Channel) | WF3 | WF2 | WF1 |

| | Vt1 | Vt2 | Vt3 | Vt4 | Vt5 | Vt6 | Vt7 | Vt8 | Vt9 |
|---|---|---|---|---|---|---|---|---|---|
| NFET | WF1 HK2 | WF1 HK3 | WF2 HK1 | WF2 HK2 | WF2 HK3 | WF3 HK1 | WF3 HK2 | WF3 HK3 | WF1 HK1 |
| PFET | WF3 HK3 | WF3 HK2 | WF3 HK1 | WF2 HK3 | WF2 HK2 | WF2 HK1 | WF1 HK3 | WF1 HK2 | WF1 HK1 |

|Vt1|<|Vt2|<|Vt3|<|Vt4|<|Vt5|<|Vt6|<|Vt7|<|Vt8|

Fig. 4C

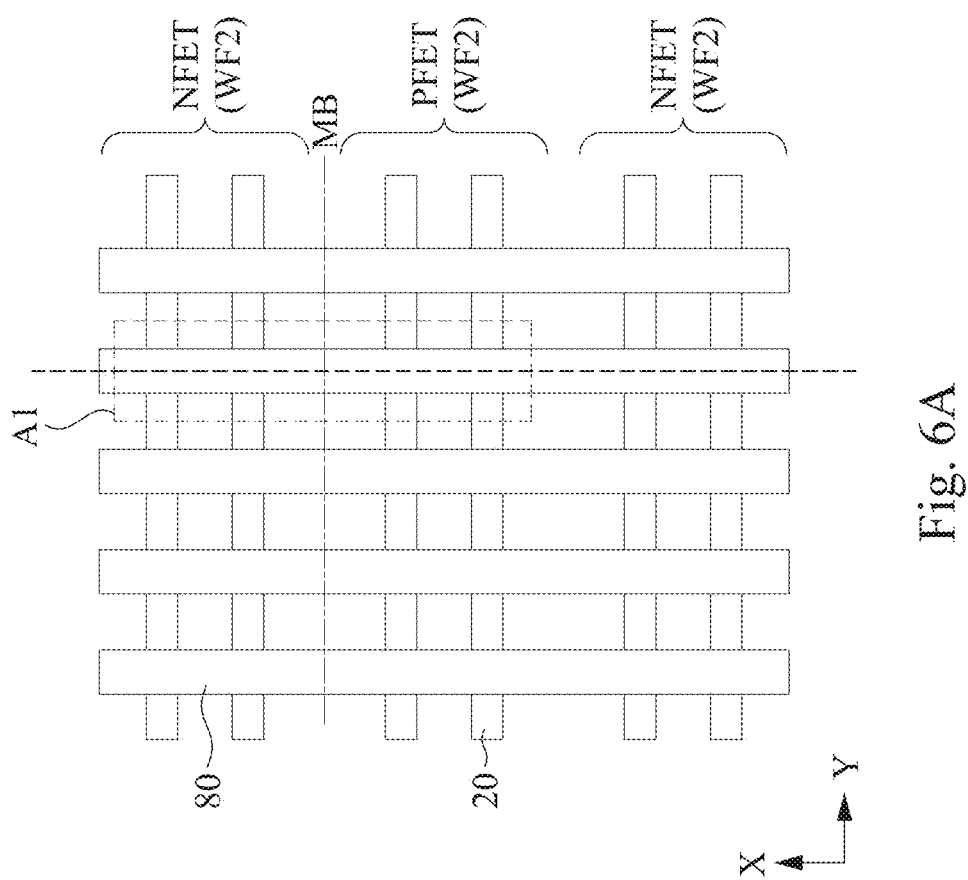

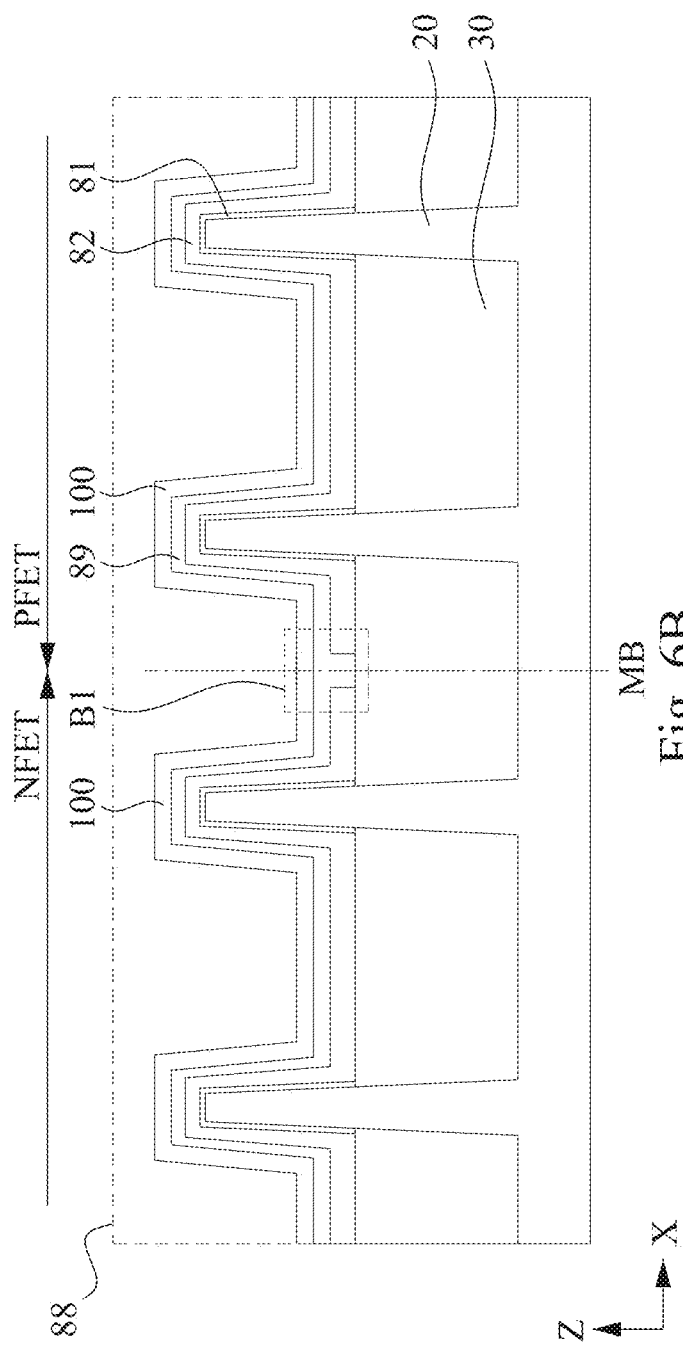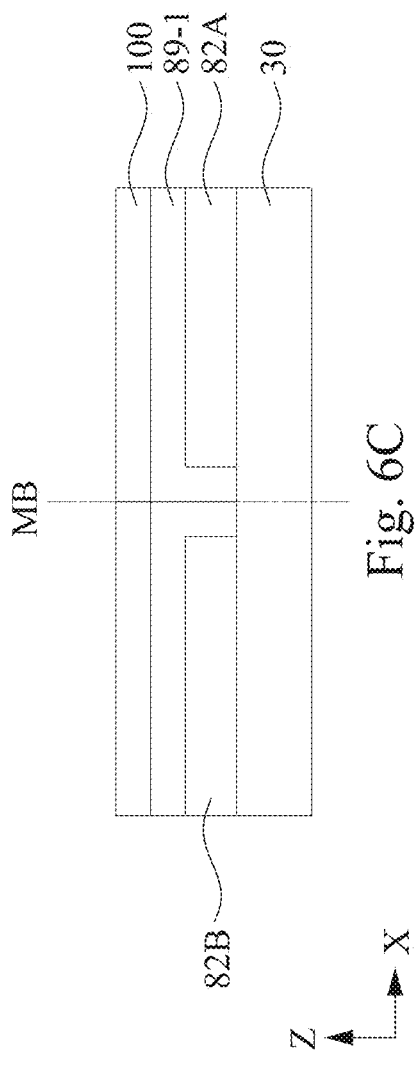

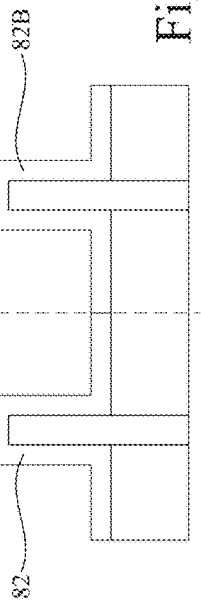
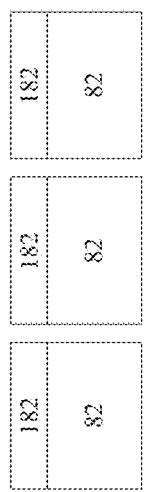
Fig. 7A
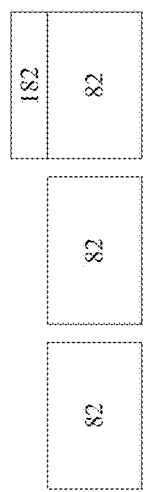
Fig. 7C
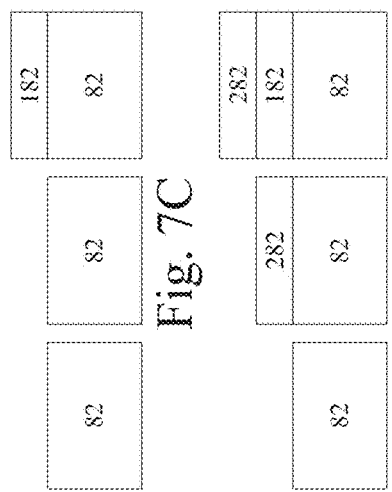
Fig. 7D
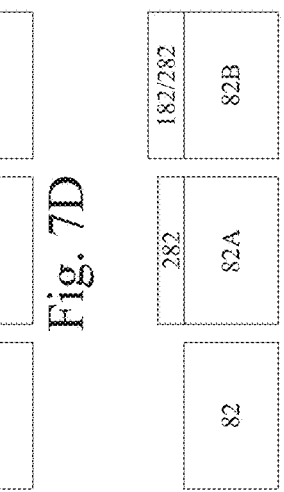
Fig. 7F
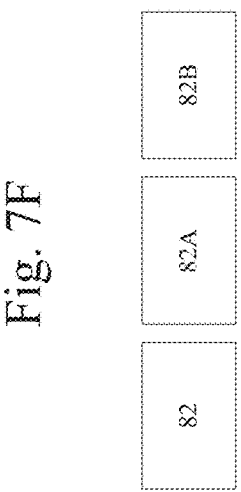
Fig. 7H

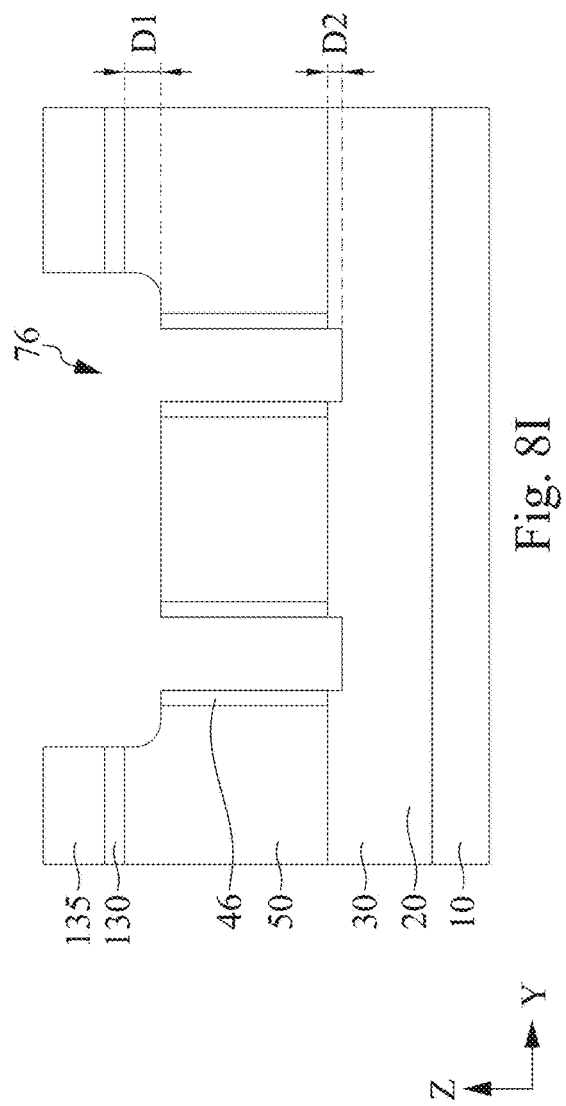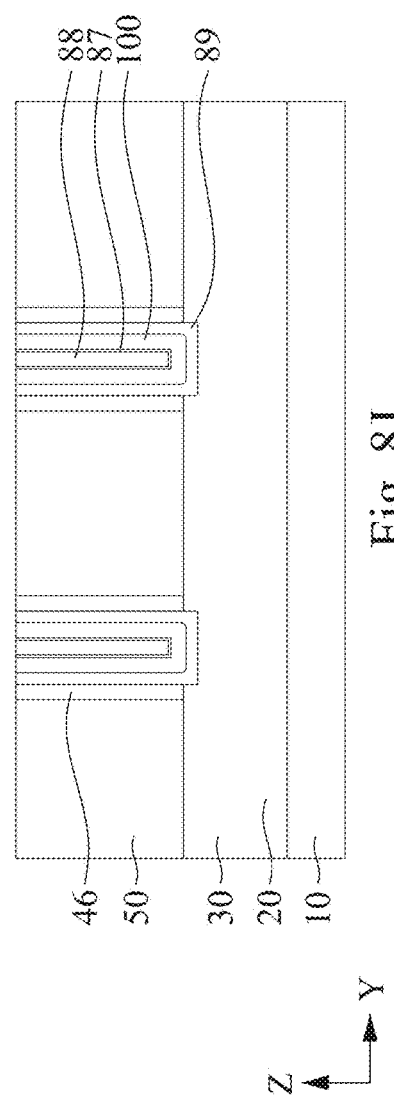

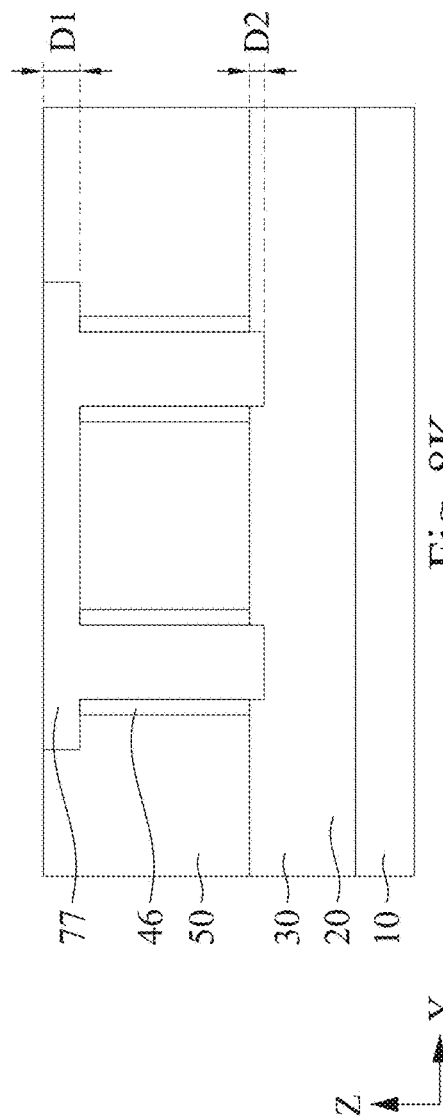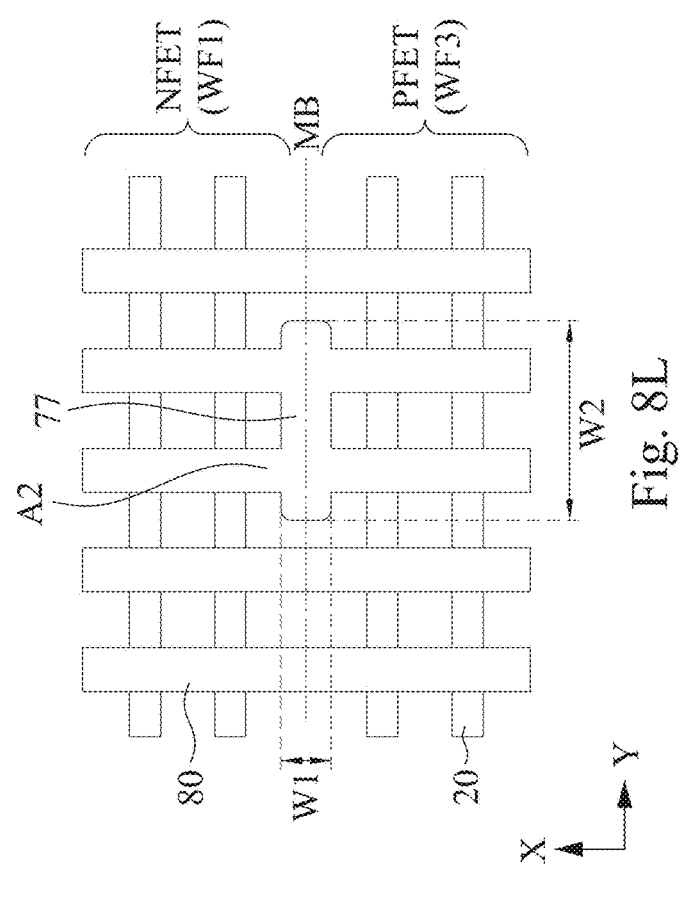

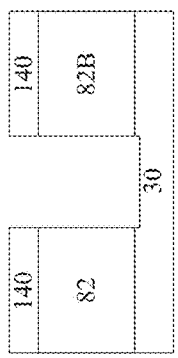
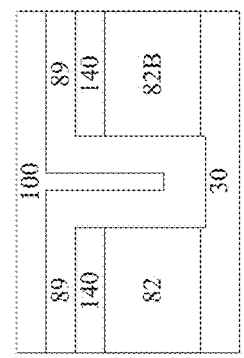
Fig. 9F
Fig. 9G
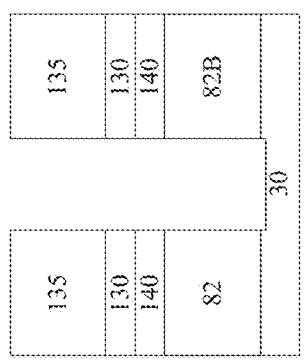
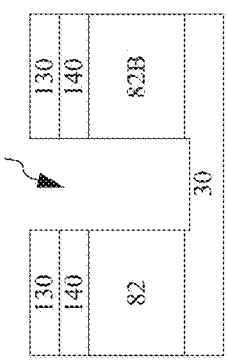
Fig. 9D
Fig. 9E
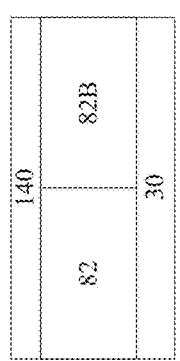
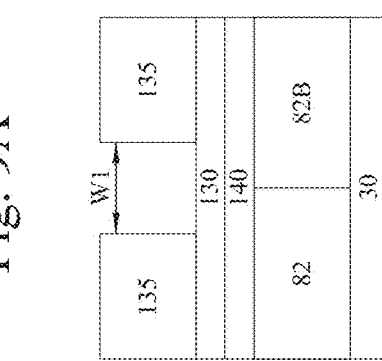
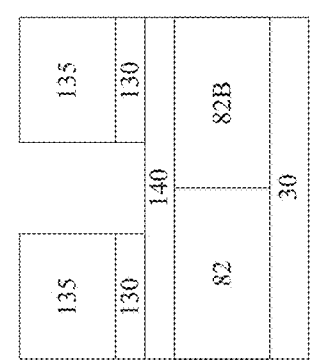
Fig. 9A
Fig. 9B
Fig. 9C

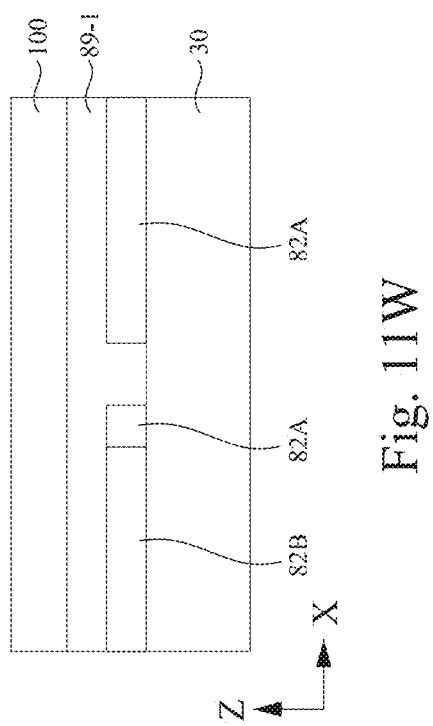
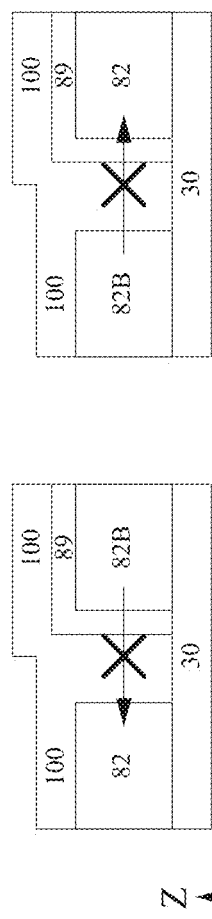
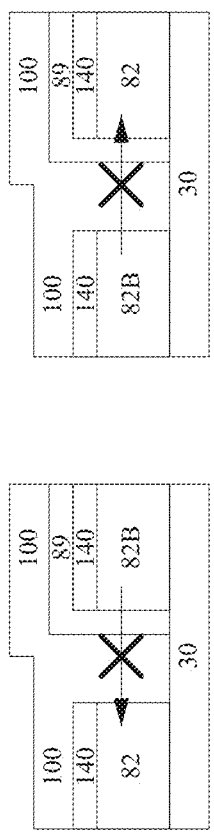

METHOD OF MANUFACTURING SEMICONDUCTOR DEVICES AND SEMICONDUCTOR DEVICES

RELATED APPLICATION

This application is a divisional of U.S. patent application Ser. No. 17/104,019, now U.S. Pat. No. 11,557,649, filed Nov. 25, 2020, which claims priority to U.S. Provisional Patent Application No. 63/045,433 filed Jun. 29, 2020, the entire contents of which are incorporated herein by reference.

BACKGROUND

With increasing down-scaling of integrated circuits and increasingly demanding requirements of speed of integrated circuits, transistors need to have higher drive currents with increasingly smaller dimensions. Three dimensional field-effect transistors (FETs) were thus developed. Three dimensional (3D) FETs include vertical semiconductor nanostructures (such as fins, nanowires, nanosheets etc.) disposed over a substrate. The semiconductor nanostructures are used to form source and drain regions, and channel regions between the source and drain regions. Shallow trench isolation (STI) regions are formed to define the semiconductor nanostructures. The 3D FETs also include gate stacks, which are formed on the sidewalls and the top surfaces of the semiconductor fins or on the all sides of nanowires, nanosheets. Since 3D FETs have a three-dimensional channel structure, ion implantation processes to the channel require extra care to reduce any geometrical effects. With increasing down-scaling of integrated circuits, the spacing between nearby devices is decreasing and the different threshold voltage devices are coming closer together causing threshold voltage shift due to various process and/or structural issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A shows a cross sectional view, FIG. 1B shows a perspective view and FIG. 1C is another cross sectional view of a semiconductor device according to an embodiment of the present disclosure.

FIG. 4A shows gate structures of multiple FETs with different threshold voltages according to embodiments of the present disclosure. FIGS. 4B and 4C show various work function adjustment material layers and high-k gate dielectric layers for multiple FETs with different threshold voltages according to embodiments of the present disclosure.

FIG. 6A shows a plan view (layout) of a CMOS circuit, FIG. 6B shows a cross sectional view corresponding to area A1 of FIG. 6A, and FIG. 6C shows an enlarged view of area B1 of FIG. 6B according to an embodiment of the present disclosure.

FIGS. 7A, 7B, 7C, 7D, 7E, 7F, 7G, 7H, and 7I show various stage of a manufacturing process of a semiconductor device according to embodiments of the present disclosure.

FIGS. 8A, 8B, 8C, 8D, 8E, 8F, 8G, 8H, 8I, 8J, 8K and 8L show various views of a sequential manufacturing process of a semiconductor device according to embodiments of the present disclosure.

FIGS. 9A, 9B, 9C, 9D, 9E, 9F and 9G show cross sectional views of various stages of a sequential manufacturing process of a semiconductor device according to embodiments of the present disclosure.

FIGS. 11A, 11B, 11C, 11D, 11E, 11F, 11G, 11H, 11I, 11J, 11K, 11L, 11M, 11N, 11O, 11P, 11Q, 11R, 11S, 11T, 11U, 11V and 11W shows various views of semiconductor devices according to embodiments of the present disclosure.

DETAILED DESCRIPTION

Figure 2B:
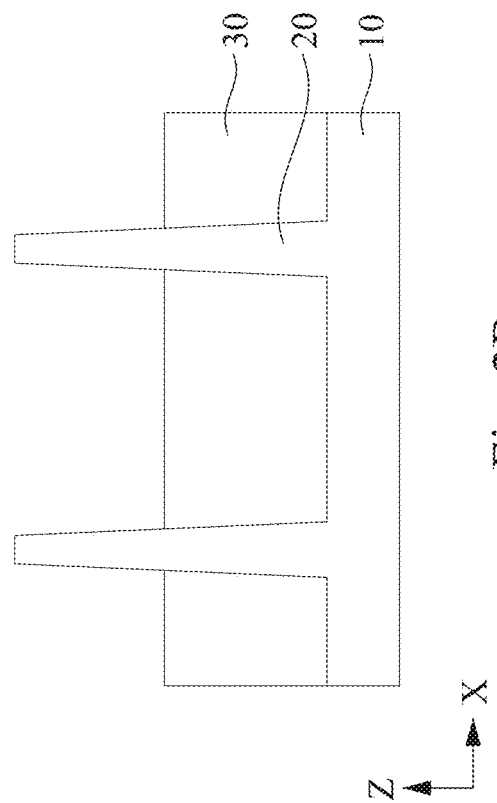
FIGS. 2A, 2B, 2C, 2D, 2E and 2F show cross sectional views of various stages of a sequential manufacturing process of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

Disclosed embodiments relate to a semiconductor device, in particular, a gate structure of a field effect transistor (FET) and its manufacturing method. The embodiments such as those disclosed herein are generally applicable not only to planar FETs but also to a fin FET (FinFET), a double-gate FET, a surround-gate FET, an omega-gate FET or a gate-all-around (GAA) FET (such as a lateral gate-all-around FET or a vertical gate-all-around FET), and/or nanowire transistors, nanosheet transistors, nano-forksheet transistors, nano-slab transistors or any suitable device having one or more work function adjustment material (WFM) layers in the gate structure.

With technology scaling down, semiconductor devices (e.g., transistors) are disposed much closer to each other, and the proximity effects (damage to nearby devices) are concerned. In FET structures, building multiple Vt devices with low Vt is very crucial for low power consumption and boosting device performance. Composition and thickness of metal gate films play a crucial role in defining the device work function. Multiple FETs having different threshold voltages can be realized by adjusting materials and/or thicknesses of a gate dielectric layer and/or one or more work function adjustment material layers (WFMs) disposed between a gate dielectric layer and a body metal gate electrode layer (e.g., a W layer). Further, a high-k dipole layer is used to form different Vt devices. When different high-k dipole layers are used as a gate dielectric layer in nearby FET devices, a cross contamination (e.g., diffusion of La) between different Vt devices using different gate dielectric layers may be a problem.

The present disclosure relates to a method and a device structure for preventing La diffusion across a boundary of different Vt devices.

FIGS. 1A and 1C show cross sectional views and FIG. 1B is a perspective view of a semiconductor device according to an embodiment of the present disclosure.

In some embodiments, a semiconductor device includes a gate stack 80 disposed over a channel region of a fin structure 20. The gate stack 80 includes an interfacial layer 81, a gate dielectric layer 82, a first conductive layer 83 as a cap layer, a second conductive layer 84 as a first barrier layer, a work function adjustment material layer or a work function adjustment layer (a WFM layer) 86, a glue layer 87 and a body gate electrode layer 88 as shown in FIG. 1A. In some embodiments, the fin structure 20 is provided over a substrate 10 and protrudes from an isolation insulating layer 30. Further, gate sidewall spacers 46 are disposed on opposite side faces of the gate stack 80 and one or more dielectric layers 50 are formed to cover the gate sidewall spacers 46. In some embodiments, a piece of insulating material 42 is disposed between the gate sidewall spacer 46 and the isolation insulating layer 30. Further, as shown in FIG. 1B, source/drain epitaxial layers 60 are formed over recessed fin structures. Although FIG. 1A shows two fin structures and FIG. 1B shows three fin structures, the number of fin structures is not limited to those shown in FIGS. 1A and 1B.

In some embodiments, a channel region of the fin structure is made of Si for an n-type FET and is made of SiGe for a p-type FET. A Ge concentration of SiGe is in a range from about 20 atomic % to 60 atomic % in some embodiments, and is in a range from about 30 atomic % to 50 atomic % in other embodiments. In some embodiments, the channel region of the n-type FET includes Ge in an amount smaller than the SiGe channel of the p-type FET. In other embodiments, the channel regions of a p-type FET and an n-type FET are both made of Si or a compound semiconductor.

In some embodiments, the first conductive layer 83 includes a metal nitride, such as WN, TaN, TiN and TiSiN. In some embodiments, TiN is used. The thickness of the first conductive layer 83 is in a range from about 0.3 nm to about 30 nm in some embodiments, and is in a range from about 0.5 nm to about 25 nm in other embodiments. In some embodiments, the first conductive layer 83 is crystalline having, e.g., columnar crystal grains. In some embodiments, the first conductive layer 83 is not formed. In some embodiments, the first conductive layer 83 is formed and then removed after an annealing operation with a wet etching process.

In some embodiments, the second conductive layer 84 includes a metal nitride, such as WN, WCN, Ru, TiAlN, AN, TaN, TiN and TiSiN. In some embodiments, TaN is used. The thickness of the second conductive layer 84 is in a range from about 0.3 nm to about 30 nm in some embodiments, and is in a range from about 0.5 nm to about 25 nm in other embodiments. In some embodiments, the second conductive layer 84 functions as a barrier layer or an etch stop layer. In some embodiments, the second conductive layer 84 is thinner than the first conductive layer 83. In some embodiments, the second conductive layer 84 is not formed.

In some embodiments, the WFM layer 86 is made of a conductive material such as a single layer of TiN, WN, WCN, Ru, W, TaAlC, TiC, TaAl, TaC, Co, Al, TiAl, or TiAlC, or a multilayer of two or more of these materials. For an n-type FET having a Si channel, an aluminum-containing layer, such as TiAl, TiAlC, TaAl and/or TaAlC and optionally one or more of TaN, TiN, WN, TiC, WCN, MoN and/or Co formed thereunder is used. For a p-type FET having a SiGe channel, one or more of TaN, TiN, WN, TiC, WCN, MoN and/or Co and one or more of TiAl, TiAlC, TaAl and TaAlC formed thereon is used.

In some embodiments, the glue layer 87 is made of one or more of TiN, Ti, and Co. In some embodiments, the body gate electrode layer 88 includes one or more layers of conductive material, such as polysilicon, aluminum, copper, titanium, tantalum, tungsten, cobalt, molybdenum, tantalum nitride, nickel silicide, cobalt silicide, TiN, WN, WCN, Ru, TiAl, TiAlN, TaCN, TaC, TaSiN, metal alloys, other suitable materials, and/or combinations thereof.

As set forth above, the first conductive layer 83 and the second conductive layer 84 are not formed in some embodiments. In such a case, one or more WFM layers are formed directly on the gate dielectric layer 82.

FIGS. 2A-3F show cross sectional views of various stages of a sequential manufacturing process of the semiconductor device according to an embodiment of the present disclosure. FIG. 3G shows a process flow of manufacturing a semiconductor device according to an embodiment of the present disclosure. It is understood that in the sequential manufacturing process, one or more additional operations can be provided before, during, and after the stages shown in FIGS. 2A-3F, and some of the operations described below can be replaced or eliminated for additional embodiments of the method. The order of the operations/processes may be interchangeable.

Figure 2A:
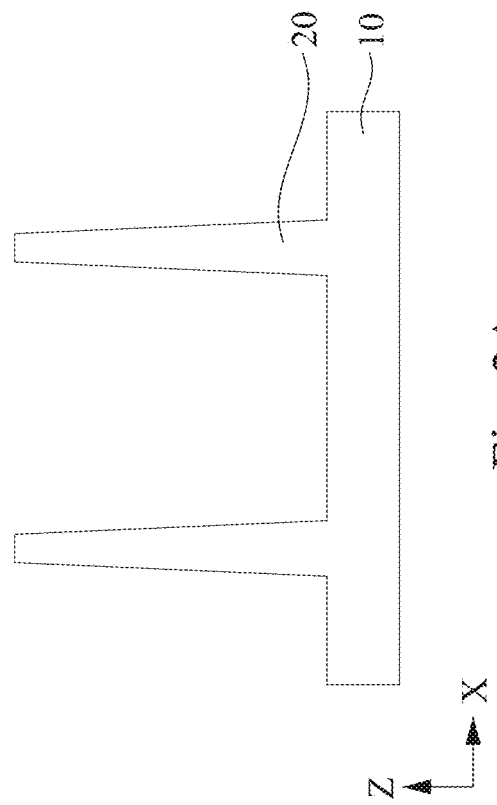

As shown in FIG. 2A, one or more fin structures 20 are fabricated over a substrate 10. The substrate 10 is, for example, a p-type silicon substrate with an impurity concentration in a range of about $1 \times 10^{15}$ cm$^{-3}$ to about $1 \times 10^{18}$ cm$^{-3}$. In other embodiments, the substrate 10 is an n-type silicon substrate with an impurity concentration in a range of about $1 \times 10^{15}$ cm$^{-3}$ to about $1 \times 10^{18}$ cm$^{-3}$. Alternatively, the substrate 10 may comprise another elementary semiconductor, such as germanium; a compound semiconductor including Group Iv-Iv compound semiconductors such as SiC and SiGe, Group III-V compound semiconductors such as GaAs, GaP, GaN, InP, InAs, InSb, GaAsP, AlGaN, AnnAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

In some embodiments, a part of the substrate 10 for p-type FETs is recessed by etching and a SiGe layer is formed over the recesses. FIGS. 2A-3F show the case of an n-FET, but most of the fabrication process is substantially the same for a p-type FET.

The fin structures 20 can be patterned by any suitable method. For example, the fin structures 20 can be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and is patterned using a photolithography process. Spacers are formed alongside the patterned sacrificial layer using a self-aligned process. The sacrificial layer is then removed, and the remaining spacers may then be used to pattern the fin structures 20.

As shown in FIG. 2A, two fin structures 20 extending in the Y direction are disposed adjacent to each other in the X direction. However, the number of the fin structures is not limited to two. The numbers may be one, three, four or five or more. In addition, one of more dummy fin structures may be disposed adjacent to both sides of the fin structures 20 to improve pattern fidelity in patterning processes. The width of the fin structure 20 is in a range of about 5 nm to about 40 nm in some embodiments, and is in a range of about 7 nm to about 15 nm in certain embodiments. The height of the fin structure 20 is in a range of about 100 nm to about 300 nm in some embodiments, and is in a range of about 50 nm to 100 nm in other embodiments. The space between the fin structures 20 is in a range of about 5 nm to about 80 nm in some embodiments, and is in a range of about 7 nm to 15 nm in other embodiments. One skilled in the art will realize, however, that the dimensions and values recited throughout the descriptions are merely examples, and may be changed to suit different scales of integrated circuits.

After the fin structures 20 are formed, an isolation insulating layer 30 is formed over the fin structures 20, as shown in FIG. 2B.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments.

After forming the isolation insulating layer 30 over the fin structures 20, a planarization operation is performed so as to remove part of the isolation insulating layer 30 and the mask layer (e.g., the pad oxide layer and the silicon nitride mask layer formed on the pad oxide layer). The planarization operation may include a chemical mechanical polishing (CMP) and/or an etch-back process. Then, the isolation insulating layer 30 is further removed so that an upper part of the fin structure 20, which is to become a channel layer, is exposed, as shown in FIG. 2B.

In certain embodiments, the partial removing of the isolation insulating layer 30 is performed using a wet etching process, for example, by dipping the substrate in hydrofluoric acid (HF). In another embodiment, the partial removing of the isolation insulating layer 30 is performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Figure 2D:
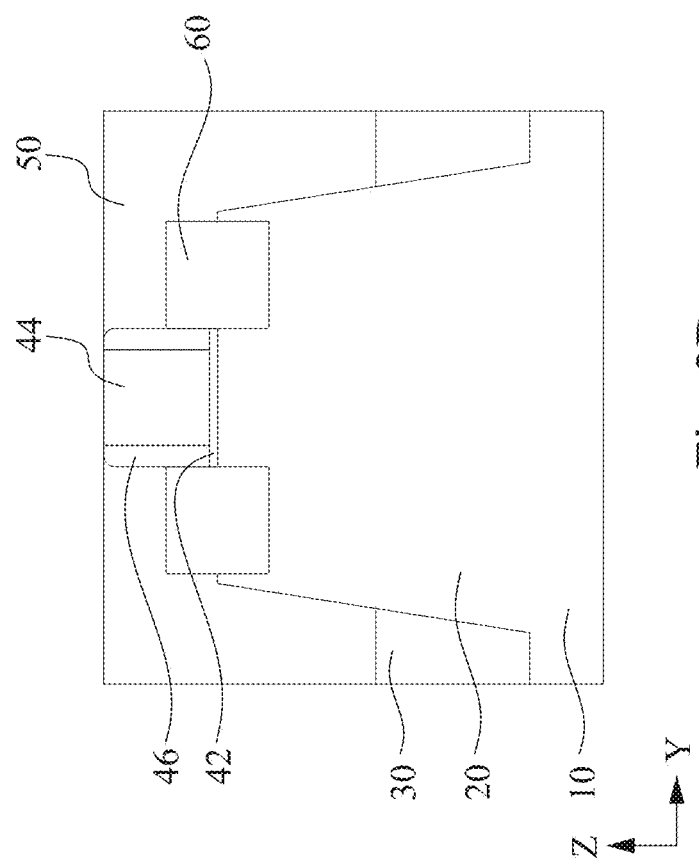
Figure 2C:
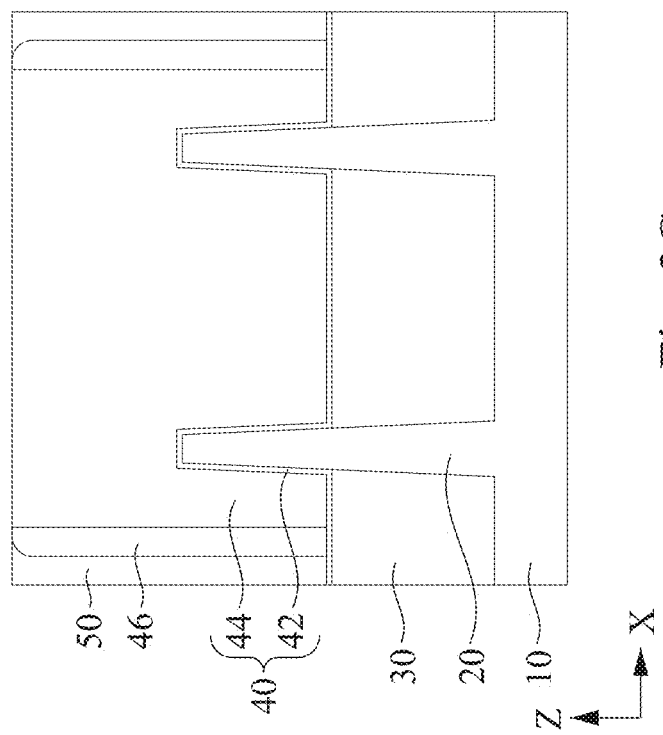

Then, a dummy gate structure 40 is formed over part of the fin structures 20 as shown in FIG. 2C.

A dielectric layer and a poly silicon layer are formed over the isolation insulating layer 30 and the exposed fin structures 20, and then patterning operations are performed so as to obtain a dummy gate structure 40 including a dummy gate electrode layer 44 made of poly silicon and a dummy gate dielectric layer 42. The patterning of the poly silicon layer is performed by using a hard mask including a silicon nitride layer and an oxide layer in some embodiments. The dummy gate dielectric layer 42 can be silicon oxide formed by CVD, physical vapor deposition (PVD), atomic layer deposition (ALD), e-beam evaporation, or other suitable process. In some embodiments, the dummy gate dielectric layer 42 includes one or more layers of silicon oxide, silicon nitride, silicon oxy-nitride, or high-k dielectrics. In some embodiments, a thickness of the dummy gate dielectric layer 42 is in a range of about 1 nm to about 5 nm.

In some embodiments, the dummy gate electrode layer 44 is doped poly-silicon with uniform or non-uniform doping. In the present embodiment, the width of the dummy gate electrode layer 44 is in the range of about 30 nm to about 60 nm. In some embodiments, a thickness of the dummy gate electrode layer is in a range of about 30 nm to about 50 nm. In addition, one of more dummy gate structures may be disposed adjacent to both sides of the dummy gate structure 40 to improve pattern fidelity in patterning processes. The width of the dummy gate structure 40 is in a range of about 5 nm to about 40 nm in some embodiments, and is in a range of about 7 nm to about 15 nm in certain embodiments.

Further, as shown in FIGS. 2C and 2D, sidewall spacers 46 are formed on opposite side faces of the dummy gate structures 40. FIG. 2D is a cross section in the y-z plane. An insulating material layer for sidewall spacers 46 is formed over the dummy gate structure 40. The insulating material layer is deposited in a conformal manner so that it is formed to have substantially equal thicknesses on vertical surfaces, such as the sidewalls, horizontal surfaces, and the top of the dummy gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming gate sidewall spacers 46. In some embodiments, the sidewall spacers 46 include two to four layers of different insulating materials. In some embodiments, part of the dummy gate dielectric layer 42 is disposed between the sidewall spacers 46 and the isolation insulating layer 30. In other embodiments, no part of the dummy gate dielectric layer 42 is disposed between the sidewall spacers 46 and the isolation insulating layer 30.

Subsequently, a source/drain region of the fin structure 20 not covered by the dummy gate structure 40 is etched down (recessed) to form a source/drain recess in some embodiments. After the source/drain recess is formed, one or more source/drain epitaxial layers 60 (see also, FIG. 1B) are formed in the source/drain recess as shown in FIG. 2D. In some embodiments, a first epitaxial layer, a second epitaxial layer and a third epitaxial layer are formed. In other embodiments, no recess is formed and the epitaxial layers are formed over the fin structure.

In some embodiments, the first epitaxial layer includes SiP or SiCP for an n-type FinFET, and SiGe or Ge doped with B for a p-type FinFET. An amount of P (phosphorus) in the first epitaxial layer is in a range from about $1\times10^{18}$ atoms/cm$^3$ to about $1\times10^{20}$ atoms/cm$^3$, in some embodiments. The thickness of the first epitaxial layer is in a range of about 5 nm to 20 nm in some embodiments, and in a range of about 5 nm to about 15 nm in other embodiments. When the first epitaxial layer is SiGe, an amount of Ge is about 25 atomic % to about 32 atomic % in some embodiments, and is about 28 atomic % to about 30 atomic % in other embodiments. The second epitaxial layer includes SiP or SiCP for an n-type FinFET, and SiGe doped with B for a p-type FinFET, in some embodiments. In some embodiments, an amount of phosphorus in the second epitaxial layer is higher than the phosphorus amount of the first epitaxial layer and is in a range of about $1\times10^{20}$ atoms/cm$^3$ to about $2\times10^{20}$ atoms/cm$^3$. The thickness of the second epitaxial layer is in a range of about 20 nm to 40 nm in this embodiment, or in a range of about 25 nm to about 35 nm in other embodiments. When the second epitaxial layer is SiGe, an amount of Ge is about 35 atomic % to about 55 atomic % in some embodiments, and is about 41 atomic % to about 46 atomic % in other embodiments. The third epitaxial layer includes a SiP epitaxial layer in some embodiments. The third epitaxial layer is a sacrificial layer for silicide formation in the source/drain. An amount of phosphorus in the third epitaxial layer is less than the phosphorus amount of the second epitaxial layer and is in a range of about $1\times10^{18}$ atoms/cm$^3$ to about $1\times10^{21}$ atoms/cm$^3$ in some embodiments. When the third epitaxial layer is SiGe, an amount of Ge is less than about 20 atomic % in some embodiments, and is about 1 atomic % to about 18 atomic % in other embodiments.

In at least one embodiment, the source/drain epitaxial layers 60 are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using a silicon source gas such as SiH$_4$, Si$_2$H$_6$, or Si$_3$H$_8$; germanium source gas such as GeH$_4$, or G$_2$H$_6$; carbon source gas such as CH$_4$ or SiH$_3$CH$_3$ and phosphorus source gas such as PH$_3$.

Still referring to FIGS. 2C and 2D, an interlayer dielectric (ILD) layer 50 is formed over the S/D epitaxial layer 60 and the dummy gate structure 40. The materials for the ILD layer 50 include compounds comprising Si, 0, C and/or H, such as silicon oxide, SiCOH and SiOC. Organic materials, such as polymers, may also be used for the ILD layer 50.

After the ILD layer 50 is formed, a planarization operation, such as CMP, is performed, so that the top portion of the dummy gate electrode layer 44 is exposed, as shown in FIG. 2D. In some embodiments, before the ILD layer 50 is formed, a contact etch stop layer, such as a silicon nitride layer or a silicon oxynitride layer, is formed.

Figure 2F:
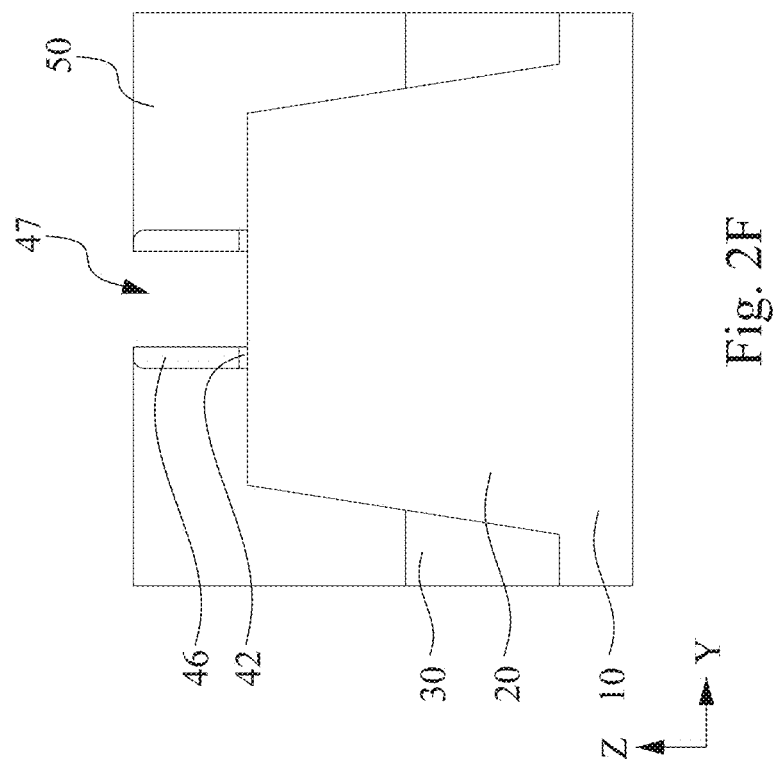
Figure 2E:
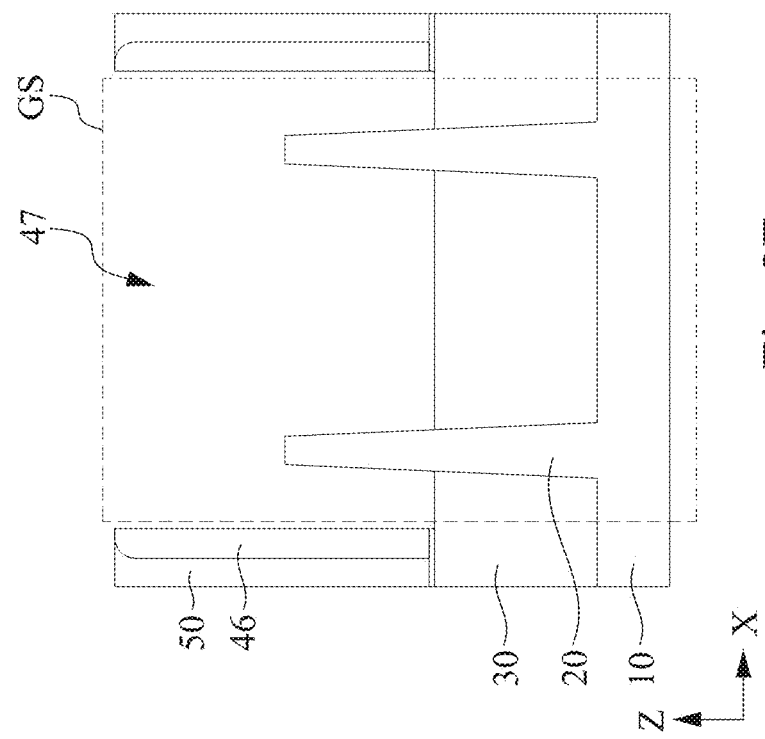

Then, the dummy gate electrode layer 44 and the dummy gate dielectric layer 42 are removed, thereby forming a gate space 47 as shown in FIGS. 2E and 2F. FIG. 2F is a cross section along the Y direction (source-to-drain direction). The dummy gate structures can be removed using plasma dry etching and/or wet etching. When the dummy gate electrode layer 44 is polysilicon and the ILD layer 50 is silicon oxide, a wet etchant such as a TMAH solution can be used to selectively remove the dummy gate electrode layer 44. The dummy gate dielectric layer 42 is thereafter removed using plasma dry etching and/or wet etching.

Figure 3B:
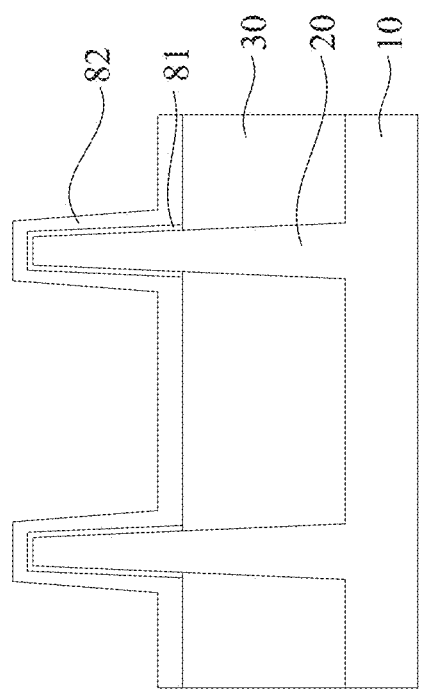
FIGS. 3A, 3B, 3C, 3D, 3E and 3F show cross sectional views of various stages of a sequential manufacturing process of a semiconductor device according to an embodiment of the present disclosure.
Figure 3A:
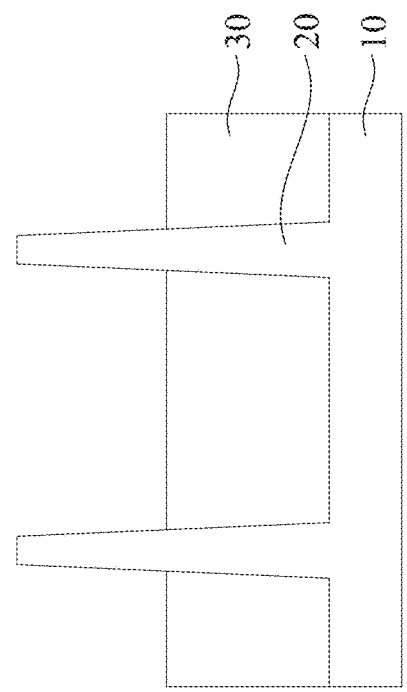
Figure 3D:
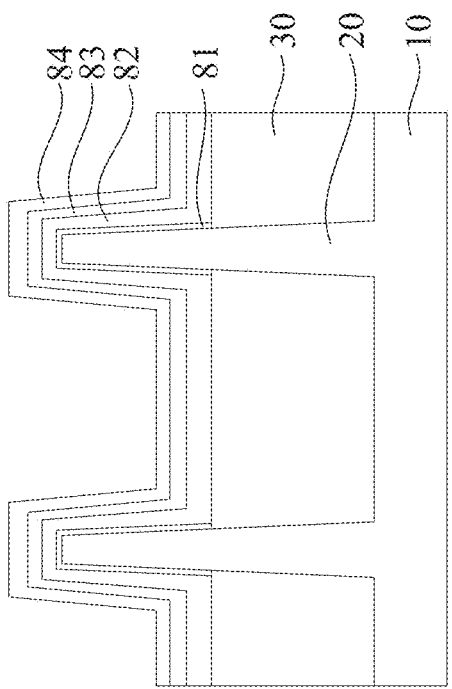

FIG. 3A shows the structure after the channel region of the fin structures 20 are exposed in the gate space 47. FIGS. 3A-3F correspond to area GS in FIG. 2E, and thus the sidewall spacers 46 and the ILD layer 50 are omitted from illustration.

Figure 3C:
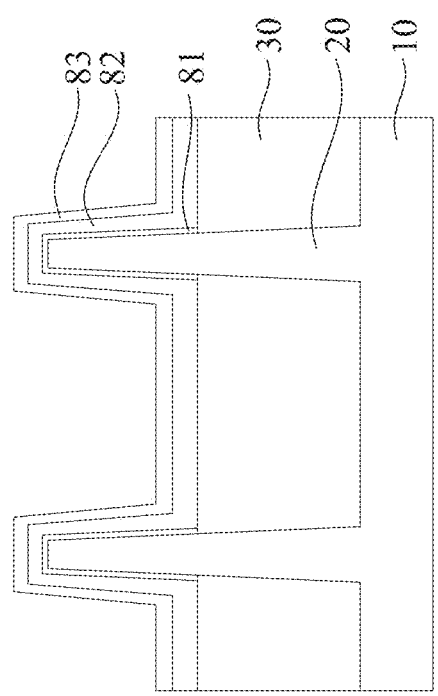
Figure 3F:
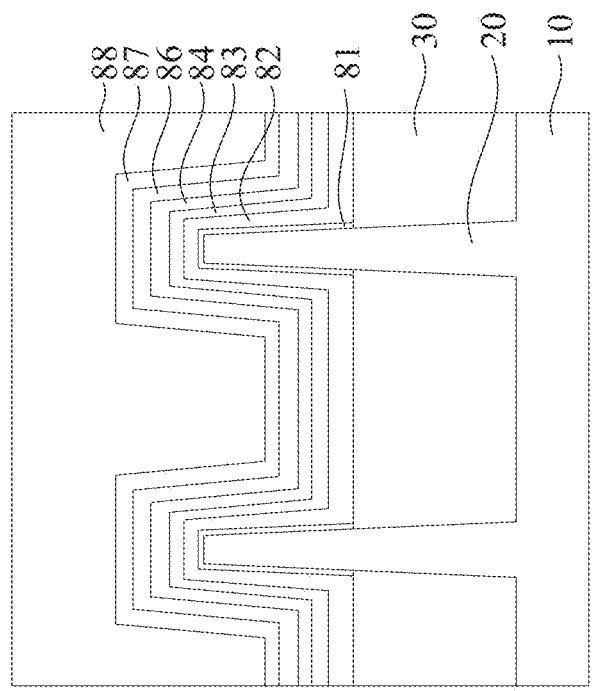
Figure 3E:
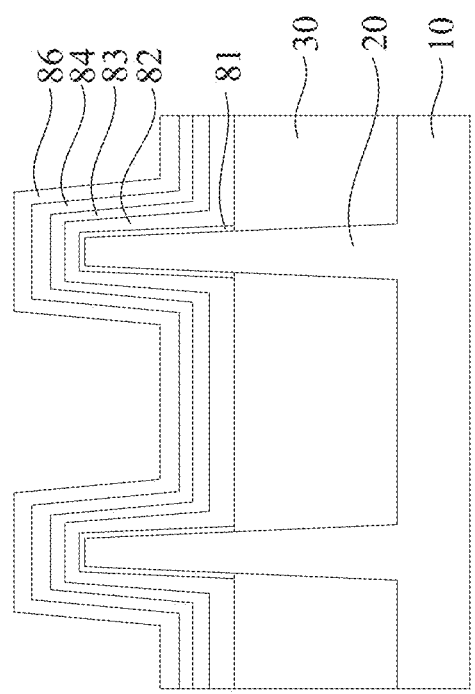
Figure 3G:
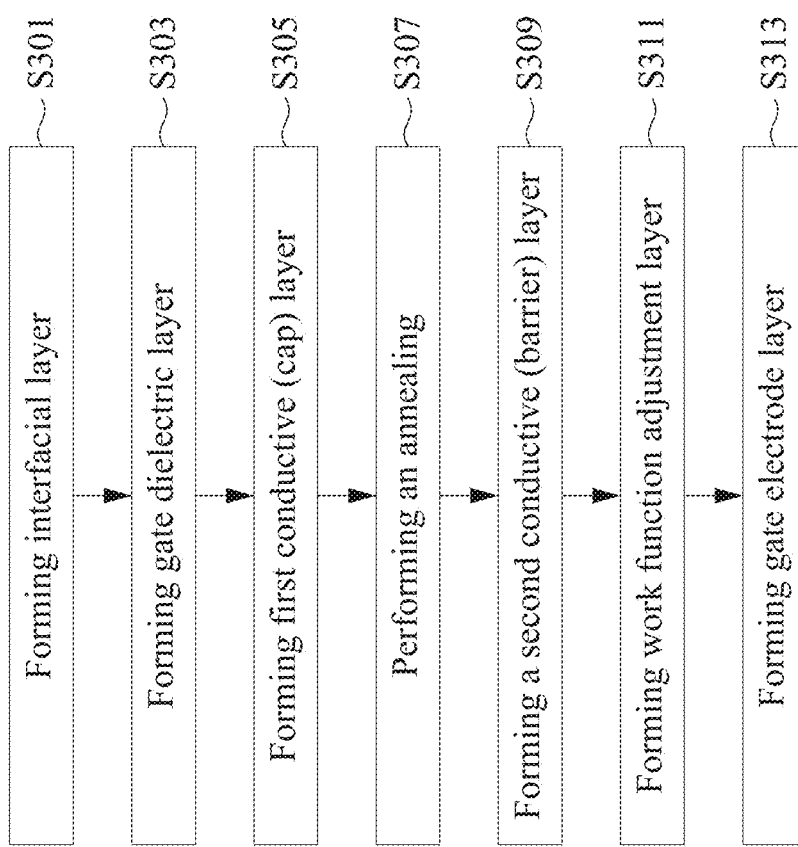
FIG. 3G shows a process flow of manufacturing a semiconductor device according to an embodiment of the present disclosure.

As shown in FIG. 3B, at S301 of FIG. 3G, an interfacial layer 81 is formed on the fin structure 20 and, at S303 of FIG. 3G, a gate dielectric layer 82 is formed on the interfacial layer 81. In some embodiments, the interfacial layer 81 is formed by using chemical oxidation. In some embodiments, the interfacial layer 81 includes one of silicon oxide, silicon nitride and silicon-germanium oxide. In some embodiments, when the channel is made of Si, the interfacial layer is a silicon oxide layer 81N, and when the channel is made of SiGe, the interfacial layer is silicon-germanium oxide layer 81P (see, FIG. 4A). The thickness of the interfacial layer 81 is in a range from about 0.6 nm to about 2 nm in some embodiments. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$, $Dy_2O_3$, $Sc_2O_3$, MgO or other suitable high-k dielectric materials, and/or combinations thereof.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layer. The thickness of the gate dielectric layer 82 is in a range from about 1 nm to about 30 nm in some embodiments.

In some embodiments, the gate dielectric layer 82 includes a La-doped hafnium oxide or LaHfOx. In some embodiments, one or more high-k dipole layers (e.g., La oxide) as described below are formed on the gate dielectric layer 82, and then an annealing operation is performed after the dipole layer is formed. Further, in some embodiments, a cleaning operation is performed to remove residues of the dipole layer generated in patterning operations of the dipole layer.

Then, as shown in FIG. 3C, at S305 of FIG. 3G, a first conductive layer 83 is formed. The first conductive layer 83 can be formed by CVD, ALD or any suitable method in some embodiments. In some embodiments, the first conductive layer 83 is made of TiN or TiSiN. In some embodiments, no first conductive layer 83 is formed.

In some embodiments, at S307 of FIG. 3G, after the first conductive layer 83 is formed, a first annealing operation is performed for about 1 nsec (spike annealing, such as a laser annealing and/or isothermal annealing) to about 360 sec at a temperature of about 600° C. to about 950° C. in some embodiments. The first annealing can help densify the gate dielectric layer 82 and incorporate nitrogen into the gate dielectric layer 82. Nitrogen helps passivate oxygen vacancies, reduce leakage and improve device reliability. The first annealing can also help form a stable intermixing layer, which helps provide a stable platform for subsequent metal gate film deposition onto the dielectric layer. When the temperature is too high, the first annealing may cause crystallization and grain boundary formation in the high-k gate dielectric layer 82, which impacts leakage performance and regrowth of the interfacial layer 81, which slows down device speed. In contrast, when the temperature is too low, the first annealing may not provide sufficient densification and/or nitridation in the high-k gate dielectric layer and cause device instability/variations during subsequent metal gate deposition processes. In some embodiments, when no first conductive layer 83 is formed, no annealing operation at this stage is performed. In some embodiments, the first conductive layer 83 is formed and then an annealing operation is performed; thereafter the first conductive layer 83 is removed with a wet etching process.

In some embodiments, the stacked structure including the interfacial layer 81, the gate dielectric layer 82 and the first conductive layer 83 is soaked in a fluorine-containing gas (e.g., $F_2$ and/or $NF_3$) for about 4 sec to about 15 min at a temperature of about room temperature (25° C.) to about 550° C. in some embodiments. Incorporation of fluorine helps improve the work function adjustment, decrease Vt of a PMOS device, passivate oxygen vacancies in the gate dielectric layer 82, reduce leakage and reduce dangling bonds in the gate dielectric layer. Thereafter, a capping layer made of, for example a crystalline, polycrystalline or amorphous Si, is formed over the first conductive layer 83, and a second annealing operation is performed for about 1 nsec (spike annealing, such as a laser annealing) to about 360 sec at a temperature of about 550° C. to about 1300° C. in some embodiments. In some embodiments, the annealing temperature is from 900° C. to 1100° C. This results in the diffusion of the fluorine into the capping layer, the first conductive layer 83 and the gate dielectric layer 82 in some embodiments. After the second annealing operation, the capping layer is removed. The second annealing with the Si capping layer also helps improve the quality of the gate dielectric layer 82. A gate dielectric layer, such as a high-k dielectric layer, is formed at a relatively low temperature to avoid crystallization and grain boundary formation, while metal gate films are deposited at relatively higher temperatures. Accordingly, it is desirable to make the high-k dielectric layer more thermally stable before the metal gate deposition. The second annealing with the capping layer at the temperature ranges as set forth above can densify the high-k dielectric layer, and make it thermally stable, without any thermal oxide inversion during the metal gate deposition. The second annealing also helps thermally in-diffuse the fluorine from the outer layers (e.g., the capping layer) into the first conductive layer 83, the gate dielectric layer 82 and the interfacial layer 81. The capping layer is used to protect the gate dielectric layer 82 and the first conductive layer 83 from undesirable oxidation damage and to isolate these films from the annealing atmosphere. After thermal stabilization of the gate dielectric layer, the capping layer is no longer required in the final device structure and therefore it is removed.

In other embodiments, no fluorine soaking operation accompanying formation of a Si capping layer and a second annealing operation is performed.

Subsequently, at S309 of FIG. 3G, a second conductive layer, as a first barrier layer 84 is formed, and then at S311 of FIG. 3G, one or more WFM layers 86 are formed. A metal gate layer including a glue layer 87 and a body metal layer (gate electrode layer) 88 is formed above the work function adjustment layer 86, at S313 of FIG. 3G.

In some embodiments, the second conductive layer 84 is made of TaN and serves as an etch stop barrier layer. The barrier layer 86 acts as a wet etching stop layer during patterning of p-type and n-type WFM layers subsequently formed to form multiple Vt devices. In some embodiments, no second conductive layer 84 is formed.

The work function adjustment material (WFM) layer 86 can be formed by ALD, PVD, CVD, e-beam evaporation, or other suitable process. Further, the WFM layer can be formed separately for the n-channel FET and the p-channel FET, which may use different metal layers. The body gate electrode layer (body metal layer) 88 and the glue layer 87 can be formed by CVD, ALD, electro-plating, or other suitable method. When the first and second conductive layers are not formed, the WFM layer 86 is directly formed on the gate dielectric layer 82. In some embodiments, the first conductive layer 83 is formed and removed after the annealing operation S307, thereafter the second conductive layer is not formed and the WFM layer 86 is directly formed on the gate dielectric layer 82.

FIG. 4A shows a cross section view of gate structures for FETs with different threshold voltages according to an embodiment of the present disclosure. FIGS. 4B and 4C show various work function adjustment material layers for multiple FETs with different threshold voltages according to embodiments of the present disclosure.

In some embodiments, a semiconductor device includes a first n-type FET N1 having a WFM layer structure WF1, a second n-type FET N2 having a WFM layer structure WF2, a third n-type FET N3 having a WFM layer structure WF3, a first p-type FET P1 having the WFM layer structure WF3, a second p-type FET P2 having the WFM layer structure WF2, and a third p-type FET P3 having the WFM layer structure WF1. A threshold voltage of the first n-type FET N1 (ultra-low voltage FET) is smaller in an absolute value than a threshold voltage of the second n-type FET N2 (low-voltage FET) and the threshold voltage of the second n-type FET N2 is smaller in an absolute value than a threshold voltage of the third n-type FET N3 (standard voltage FET). Similarly, a threshold voltage of the first p-type FET P1 (ultra-low voltage FET) is smaller in an absolute value than a threshold voltage of the second p-type FET P2 (low voltage FET) and the threshold voltage of the second p-type FET P2 is smaller in an absolute value than a threshold voltage of the third p-type FET P3 (standard voltage FET). The threshold voltage in an absolute value of the first n-type FET N1 is designed to have substantially the same threshold voltage (e.g., ±1 mV) in an absolute value of the first p-type FET P1, the threshold voltage in an absolute value of the second n-type FET N2 is designed to have substantially the same threshold voltage (e.g., ±1 mV) in an absolute value of the second p-type FET P2, and the threshold voltage in an absolute value of the third n-type FET N3 is designed to have substantially the same threshold voltage (e.g., ±1 mV) in an absolute value of the third p-type FET P3.

In some embodiments, the WFM layer structure WF1 includes a first WFM layer 100, the WFM layer structure WF2 includes, closer to the gate dielectric layer 82, a second WFM layer 89-2 and the first WFM layer 100, and the WFM layer structure WF3 includes, closer to the gate dielectric layer 82, a third WFM layer 89-1, the second WFM layer 89-2 and the first WFM layer 100, as shown in FIG. 4A.

In FIG. 4B, the semiconductor device includes three different threshold voltage levels. In other embodiments, as shown in FIG. 4C, more than three, e.g., nine different threshold voltages are utilized for an n-type FET and a p-type FET, respectively. In FIG. 4C, not only the WFM layer structures but also configurations HK1, HK2 and HK3 of the gate dielectric layer 82 (e.g., material, thickness, etc.) are adjusted to obtain a desired threshold voltage. HK1, HK2, HK3 are composed of different materials such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$, $Dy_2O_3$, $Sc_2O_3$, MgO or other suitable high-k dielectric materials, and/or combinations thereof. In some embodiments, HK1, HK2 and HK3 are composed of a high-k dielectric with some different concentrations of rare-earth metal and/or Group-III dopants (such as, La, Al, Mg, Sc, Dy, Y, Ti, Lu, Sr etc.). In some embodiments, HK3 is composed of HfOx, HK2 is composed of HfLaOx (or HfYOx, HfLuOx, HfSrOx, HfScOx, HfDyOx) and HK1 is composed of HfLaOx (or HfYOx, HfLuOx, HfSrOx, HfScOx, HfDyOx), such that the amount of La (or Y, Lu, Sr, Sc, Dy) in HK1 is higher than that in HK2. In some embodiments, HK1 is composed of HfOx, HK2 is composed of HfAlOx (or HfZrOx, HfTiOx) and HK3 is composed of HfAlOx (or HfZrOx, HfTiOx), such that the amount of Al (or Zr, Ti) in HK3 is higher than that in HK2. In some embodiments, HK2 is composed of HfOx, HK1 is composed of HfLaOx (or HfYOx, HfLuOx, HfSrOx, HfScOx, HfDyOx) and HK3 is composed of HfAlOx (or HfZrOx, HfTiOx). The thicknesses of HK1, HK2 and HK3 are in the range from about 0.6 nm to about 30 nm in some embodiments. In some embodiments, more than three different high-k dielectric films are used.

In some embodiments, HK1 includes hafnium oxide, HK2 includes La-doped hafnium oxide and HK3 includes a La-doped hafnium oxide having a higher La amount than HK2.

Figure 5A:
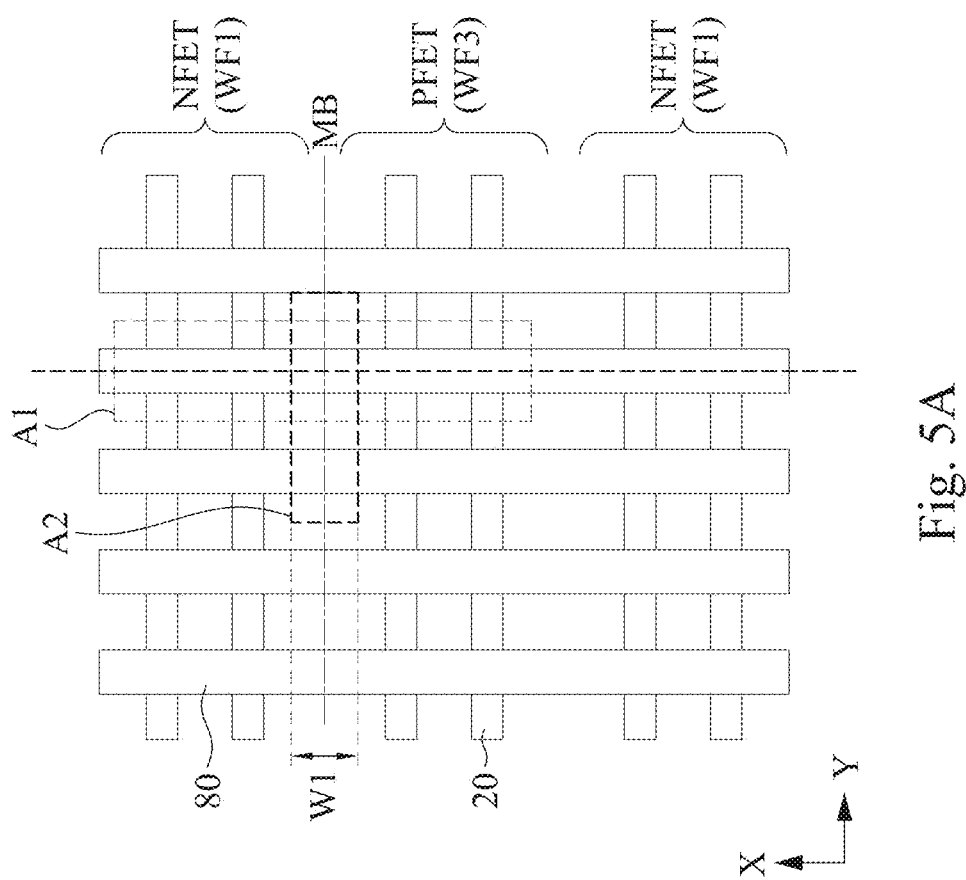
FIG. 5A shows a plan view (layout) of a CMOS circuit.

In a CMOS device, a gate electrode is commonly used for (shared by) an n-type FET and p-type FET, and thus an n-type FET and p-type FET having substantially the same threshold voltage are selected. For example, a CMOS device having an ultra-low voltage FET includes the first n-type FET N1 and the first p-type FET P1. FIG. 5A shows a plan view (layout) of such a CMOS device.

Figure 5B:
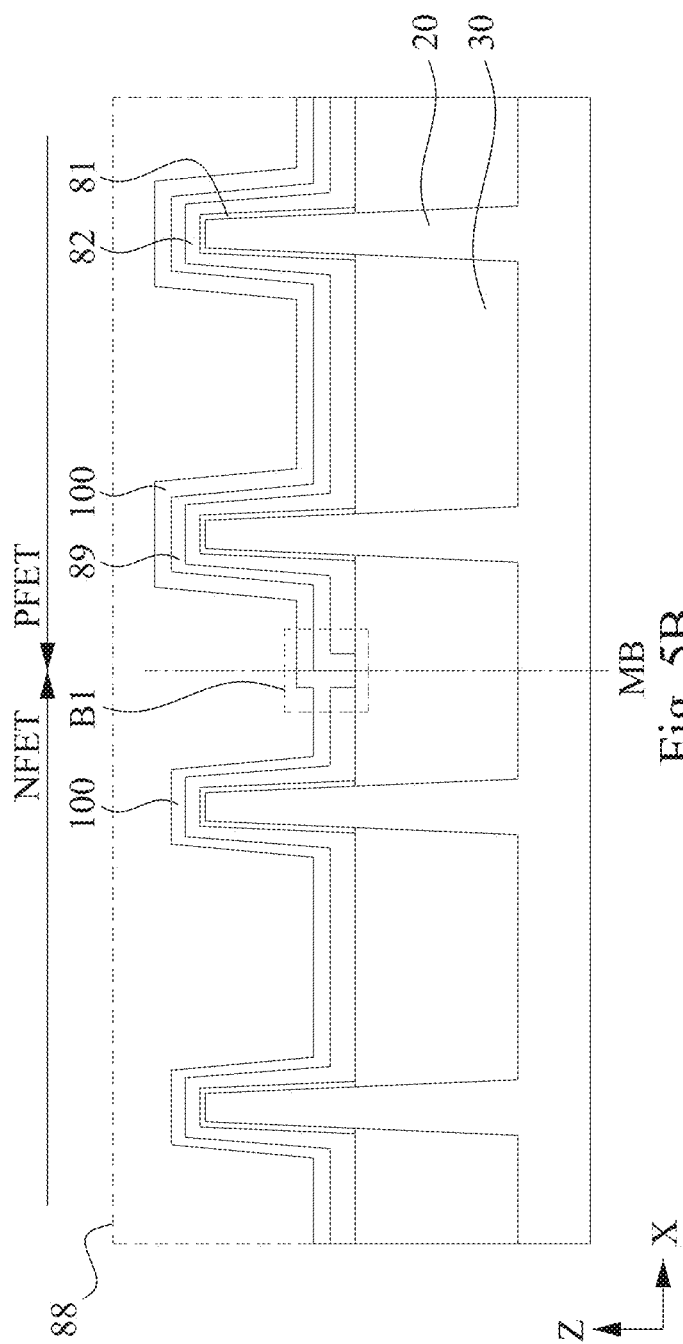
FIG. 5B shows a cross sectional view corresponding to area A1 of FIG. 5A.
Figure 5C:
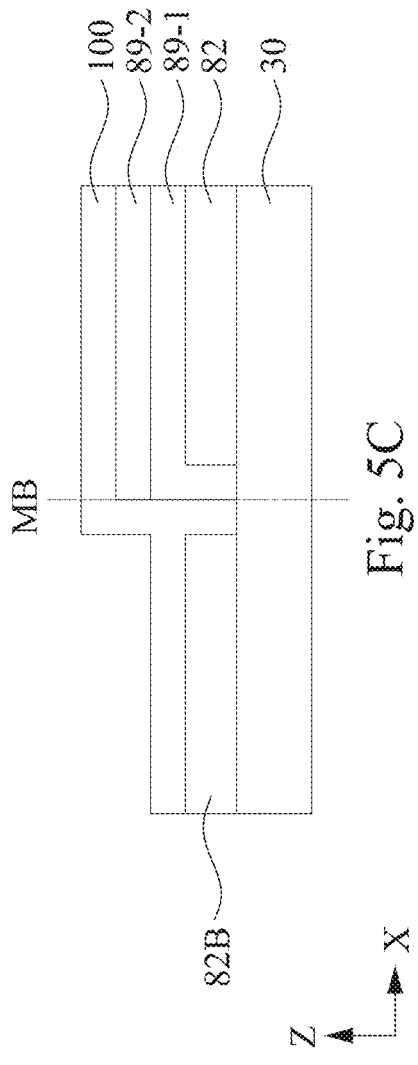
FIG. 5C shows an enlarged view of area B1 of FIG. 5B according to an embodiment of the present disclosure.

As shown in FIG. 5A, a gate electrode 80 is disposed over the channel regions of one or more fin structures 20. In some embodiments, each of the n-type FET NFET and the p-type FET PFET includes two fin structures. In other embodiments, the number of the fin structures per FET is one or three or more (up to, e.g., 10). FIG. 5B shows a cross sectional view corresponding to area A1 of FIG. 5A and FIG. 5C shows an enlarged view of area B1 of FIG. 5B. In FIGS. 5B and 5C, the glue layer 87 and the body metal layer 88 (shown in broken line) are omitted.

In some embodiments, the n-type FET NFET (e.g., N1) and the p-type FET PFET have different gate dielectric layers (different materials). In some embodiments, the n-type FET includes a dipole high k dielectric layer 82B (e.g., highly La-doped hafnium oxide), while the p-type FET includes a high-k dielectric layer 82 (e.g., no La-doped hafnium oxide). Further, the n-type FET NFET has the WFM layer structure WF1 having the first WFM layer 100 (only), and the p-type FET (e.g., P1) has the WFM layer structure WF3 having the second and third WFM layers (89-2 and 89-1, which are collectively referred to as 89 in FIG. 5B) and the first WFM layer 100. As shown in FIG. 5C, the gate dielectric layers of the n-type FET and the p-type FET are discontinuous, and separated by a part of the first WFM layer 100 and a part of the second and third WFM layers 89-1 and 89-2.

Similarly, in FIGS. 6A-6C, a CMOS device having a threshold voltage Vt4 includes an n-type FET with a WFM layer structure WF2 and a p-type FET with a WFM layer structure WF2 (see, FIG. 4C), and the n-type FET NFET (e.g., N1) and the p-type FET PFET have different gate dielectric layers (different materials). In some embodiments, the n-type FET includes a second dipole high-k dielectric layer 82B (e.g., high La-doped hafnium oxide), while the p-type FET includes a first dipole high-k dielectric layer 82A (e.g., low La-doped hafnium oxide). As shown in FIG. 6C, the gate dielectric layers of the n-type FET and the p-type FET are discontinuous, and separated by a part of the second WFM layer 89-1.

As set forth above, the gate dielectric layers made of different materials are separated from each other under the WFM layers, and thus it is possible to suppress cross contamination, such as La diffusion from a high La region to a low La region.

FIGS. 7A-7I show various stages of manufacturing gate dielectric layers for different Vt devices according to embodiments of the present disclosure. FIGS. 7A, 7C, 7D, 7F and 7H show three regions of a gate space in which a gate dielectric layer is formed for different Vt devices. Although three regions are arranged as shown, the order of the regions is not limited to. Although three regions are shown, only two regions which are nearby are provided to one gate space as shown in FIGS. 7B, 7E, 7G and 7I in some embodiments.

After the structure shown in FIG. 3A in which a gate space is formed, as shown in FIGS. 7A and 7B, an interfacial layer (not shown in FIGS. 7A and 7B) is formed and then a high-k (non-dipole) dielectric layer 82 is formed on the interfacial layer. Further, a first dipole high-k dielectric layer 182 is formed on the high-k dielectric layer 82. In some embodiments, the first dipole high-k dielectric layer 182 includes one or more of $La_2O_3$, $Lu_2O_3$, $Sc_2O_3$, SrO, $ZrO_2$, $Y_2O_3$, $DyO_x$, $EuO_x$ and $Yb_2O_3$. In certain embodiments, the first dipole high-k dielectric layer 182 is made of lanthanum oxide ($La_2O_3$). In some embodiments, at least one of the materials of the high-k dielectric layer 82 (base dielectric layer) for three regions is different from the other two regions.

Then, as shown in FIG. 7C, the first dipole high-k dielectric layer 182 is patterned such that the first dipole high-k dielectric layer 182 is removed from the first region and the second region (left and center regions in FIG. 7C) and remains in the third region (right region in FIG. 7C).

Next, a second dipole high-k dielectric layer 282 is formed on the high-k dielectric layer 82 in the first and second regions and on the first dipole high-k layer 182 in the third regions, and then a patterning operation is performed such that the second dipole high-k dielectric layer 282 is removed from the first region and remains in the second and third regions, as shown in FIG. 7D. FIG. 7E also shows after the second high-k dipole layer 282 is patterned. The second dipole high-k dielectric layer 282 is made of the same material as or different material than the first dipole high-k dielectric layer 182, and includes one or more of $La_2O_3$, $Lu_2O_3$, $Sc_2O_3$, SrO, $CeO_2$, $Y_2O_3$, $DyO_x$, $EuO_x$ and $Yb_2O_3$.

After the structure shown in FIGS. 7D and 7E is formed, in some embodiments, an annealing operation is performed at a temperature between 400° C. to about 700° C. for about 2 sec to about 100 sec to drive-in the dipole doping elements from the first and/or second dipole high-k dielectric layers 182, 282 into the base high-k dielectric layer 82, to form high-k dielectric layers 82A and 82B with different amounts of dopants, as shown in FIGS. 7F and 7G. In some embodiments, the dipole doping elements includes one or more of La, Lu, Sc, Sr, Ce, Y, Dy, Eu and Yb, which is contained in the first and second dipole high-k dielectric layers 182, 282. In certain embodiments, the doping element is La.

In some embodiments, the dipole element diffusion layers 82A and 82B are formed at a part of the high-k dielectric layer 82 and in other embodiments, the high-k dielectric layer 82 is fully converted to the dipole element diffusion layers 82A and 82B. The amount of the dipole dopant elements diffused into the layer 82A is smaller than that into the layer 82B in some embodiments. When the second dipole high-k dielectric layer 282 is made of a different material than the first dipole high-k dielectric layer 182, at least one dopant in the layer 82B is different from layer 82A. In some embodiments, after the annealing operation, an optional wet etching is performed to remove the residues of the dipole layers 182 and 282 either partly or completely, as shown in FIGS. 7H and 7I.

In some embodiments, the doping amount of the dipole element (e.g., La) in the low diffusion dipole element high-k dielectric layer 82A is more than about 10-100 times the doping amount of the dipole element in the high-k dielectric layer 82, the doping amount of the dipole element in the high diffusion dipole element high-k dielectric layer 82B is more than about 3-100 times the doping amount of the dipole element in the low diffusion dipole element high-k dielectric layer 82A. In some embodiments, the doping amount of the dipole element (e.g., La) in the low diffusion dipole element high-k dielectric layer 82A is in a range from about $2\times10^{13}$ atoms/$cm^2$ to about $3\times10^{15}$ atoms/$cm^2$, and the doping amount of the dipole element in the high diffusion dipole element high-k dielectric layer 82B is higher than that in layer 82A and is in a range from about $6\times10^{13}$ atoms/$cm^2$ to about $8\times10^{17}$ atoms/$cm^2$. In some embodiments, the normal high-k dielectric layer 82 may contain the dipole element in a range from about 0 atoms/$cm^2$ to about $5\times10^{13}$ atoms/$cm^2$, which is smaller than that of layer 82A.

As set forth above, when the dipole element diffused high-k dielectric layer (e.g., 82A and 82B) is adjacent to the normal high-k dielectric layer, or different concentration layers are adjacent to each other, the dipole dopant element diffuses across the boundary, which may cause a Vt shift or other electrical issues. In the present embodiments, a patterning operation to cut the gate dielectric layer at the boundary and fill the cut region (e.g., groove) with another material to suppress the diffusion of the dipole dopant.

FIGS. 8A-8J show cross sectional views of various stages of manufacturing the semiconductor device according to embodiments of the present disclosure. It is understood that in the sequential manufacturing process, one or more additional operations can be provided before, during, and after the stages shown in FIGS. 8A-8J and some of the operations described below can be replaced or eliminated for additional embodiments of the method. The order of the operations/processes may be interchangeable. Materials, configurations, dimensions, processes and/or operations as described with respect to embodiments of FIGS. 1A-7I can be employed in the following embodiments, and detailed description thereof may be omitted.

Figure 8A:
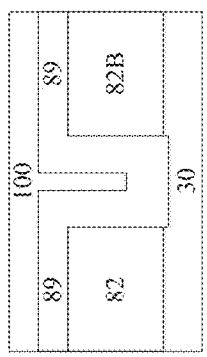

FIG. 8A shows a cross sectional view after the dipole element doped high-k dielectric layer 82B is formed as explained with respect to FIGS. 7A-7I. As shown in FIG. 8A, the high-k dielectric layer 82 is in contact with the dipole element doped (high-doped) high-k dielectric layer 82B in some embodiments. In other embodiments, the high-k dielectric layer 82 is in contact with the dipole element doped (low-doped) high-k dielectric layer 82A, or the dipole element doped (low-doped) high-k dielectric layer 82A is in contact with the dipole element doped (high-doped) high-k dielectric layer 82B. The boundary is located over the isolation insulating layer 30 (see, FIGS. 5C and 6C).

Figure 8B:
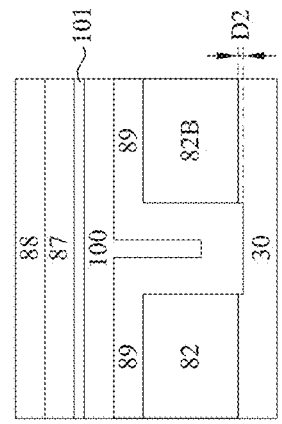

Then, as shown in FIG. 8B, a hard mask layer 130 is formed over the gate dielectric layers 82 and 82B, and further a mask pattern 135 is formed over the hard mask layer 130.

In some embodiments, the hard mask layer 130 includes one or more of aluminum oxide, aluminum nitride, aluminum oxynitride, titanium oxide, titanium oxynitride, titanium nitride, tantalum oxynitride. The thickness of the hard mask layer 130 is in a range from about 0.5 nm to about 20 nm in some embodiments, and is in a range from about 0.8 nm to about 10 nm in other embodiments. When the thickness is too small, the hard mask layer 130 may not sufficiently function as a hard mask and/or the adhesion to the BARC layer may be insufficient, and when the thickness is too large, patterning of the hard mask layer may be difficult. The hard mask layer 130 can be formed by CVD, PVD, ALD, e-beam evaporation, or other suitable process.

The mask pattern 135 includes a photo resist pattern with an organic bottom antireflective coating (BARC) layer, or a patterned BARC layer. The mask pattern 135 is an opening (trench) pattern 76 corresponding to area A2 shown in FIG. 5A. The width W1 of the opening in the X direction is in a range from about 10 nm to about 150 nm in some embodiments, and is in a range from about 14 nm to about 120 nm in other embodiments. The minimum width may be limited to the lithography resolution and when the width is smaller than the ranges, the barrier effect may be insufficient. When the width is greater than the ranges, the trench is too close to the fin structure, and may cause damage to the fin structures.

Figure 8C:
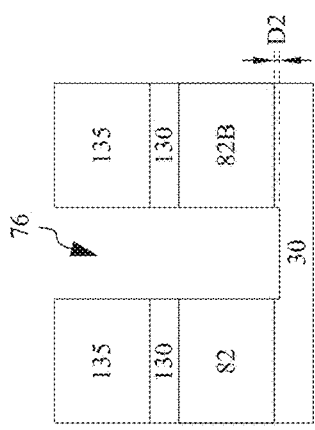

As shown in FIG. 8C, the hard mask layer 130 is patterned by using the mask pattern 135 as an etching mask by wet and/or dry etching. The wet etchant includes an aqueous solution of $NH_4OH$, $H_2O_2$, and/or HCl, or an aqueous solution of $NH_4F$ and HF in some embodiments. The dry etching uses etching gas including $BCl_3$ or other chlorine-containing gas in some embodiments.

Figure 8D:
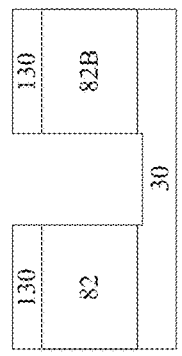
Figure 8E:

Further, as shown in FIG. 8D, the high-k gate dielectric layers 82 and 82B are patterned by using the mask pattern 135 and the patterned hard mask layer 130 as an etching mask, thereby forming a trench or opening 76. Then, the mask pattern 135 is removed as shown in FIG. 8E. When the mask pattern 135 is made of an organic material, such as BARC, a plasma ashing process using $N_2$, $H_2$, $Cl_2$, $O_2$ and/or $CF_4$ gases is used. In other embodiments, the mask pattern 130 is removed before the gate dielectric layers 82 and 82B are patterned, and the high-k gate dielectric layers 82 and 82B are patterned by using the patterned hard mask layer 135 as an etching mask.

Figure 8F:
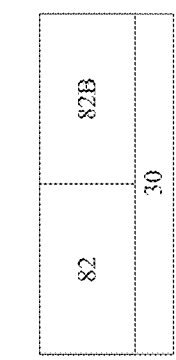

Subsequently, the patterned hard mask layer 130 is removed as shown in FIG. 8F. In some embodiments, the patterned hard mask layer 130 is removed by using wet etching. The wet etchant includes an aqueous solution of $NH_4OH$, $H_2O_2$, and/or HCl, or an aqueous solution of $NH_4F$ and HF in some embodiments. In other embodiments, the patterned hard mask layer 130 is removed by dry etching. The etching gas includes $BCl_3$ or other chlorine-containing gas in some embodiments.

In some embodiments, in the etching of the high-k gate dielectric layers 82 and 82B, a part of the ILD layer 50 and a part of the isolation insulating layer 30 are also etched, as shown in FIGS. 8D and 8I. FIG. 8I is the Y directional cross section, while FIG. 8D is the X directional cross section. In some embodiments, the etched amount D1 of the ILD layer 50 is in a range from about 2 nm to about 5 nm and the etched amount D2 of the isolation insulating layer 30 is in a range from about 1 nm to about 4 nm. As set forth above, the mask pattern 135 is an opening pattern corresponding to area A2 shown in FIG. 5A and disposed over two gate spaces. In other embodiments, the mask pattern 135 is disposed over only one gate space, or more than two gate spaces.

Figure 8G:
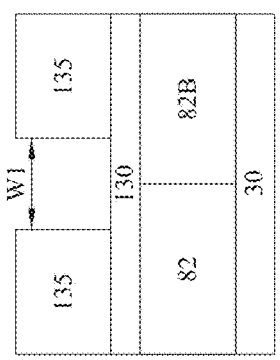
Figure 8H:
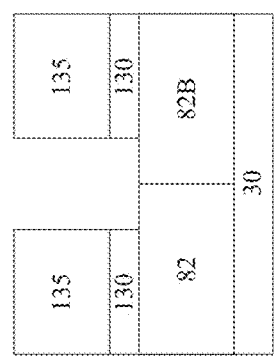

After the gate dielectric layers 82 and 82B are separated as shown in FIG. 8F, the WFM layer 89 is formed and the WFM layer 100 is formed over the WFM layer 89 to fill the gap between the high-k gate dielectric layer 82 and the dipole element doped high-k dielectric layer 82B, as shown in FIG. 8G. Further, as shown in FIGS. 8H and 8J, a glue layer 87 and the body metal layer 88 are formed. In some embodiments, a cap layer 101 is formed over the WFM layer 100. In some embodiments, the cap layer 101 includes one or more of TiN, TiSiN, Ta or TaN. As shown in FIGS. 8I and 8J, a part of the WFM layer 89 penetrates into the isolation insulating layer 30.

In some embodiments, adjacent gate electrodes are connected by a connection pattern 77 as shown in FIGS. 8K and 8L. FIG. 8K is a plan view after the body metal layer 88 is formed. In FIGS. 8K and 8L, the layers constituting the gate electrode are omitted for simplicity. In some embodiments, as shown in FIGS. 8K and 8L, when the opening (trench) 76 is formed over two gate spaces, the adjacent gate electrodes are connected by a connection pattern 77 made of the same conductive materials of the gate electrodes filled in the trench 76. The gate dielectric layer in the NFET region is different in terms of the dipole element concentration than the gate dielectric layer in the PFET region. In other embodiments, since the metal gate structure is planarized or recessed, the gate connection pattern does not exist (see FIG. 8J).

FIGS. 9A-9G show cross sectional views of various stages of manufacturing the semiconductor device according to embodiments of the present disclosure. It is understood that in the sequential manufacturing process, one or more additional operations can be provided before, during, and after the stages shown in FIGS. 9A-9G and some of the operations described below can be replaced or eliminated for additional embodiments of the method. The order of the operations/processes may be interchangeable. Materials, configurations, dimensions, processes and/or operations as described with respect to embodiments of FIGS. 1A-8J can be employed in the following embodiments, and detailed description thereof may be omitted.

As shown in FIG. 9A, after the structure shown in FIG. 8A is formed, another dielectric layer 140 is formed over the gate dielectric layers 82 and 82B. In some embodiments, the another dielectric layer 140 includes a high-k dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, or any other suitable material. The another dielectric layer 140 includes no dipole elements in some embodiments. The another dielectric layer 140 is used to suppress defects in the gate dielectric layer and to improve the k-value of overall gate dielectric layer. In some embodiments, the another dielectric layer 140 is made of the same or different materials than the high-k dielectric layer 82.

Then, as shown in FIG. 9B, similar to FIG. 8B, a hard mask layer 130 is formed over the another dielectric layer 140, and further a mask pattern 135 is formed over the hard mask layer 130.

As shown in FIG. 9C, similar to FIG. 8C, the hard mask layer 130 is patterned by using the mask pattern 135 as an etching mask. Further, as shown in FIG. 9D, the another dielectric layer 140 and the high-k gate dielectric layers 82 and 82B are patterned by using the mask pattern 135 and the patterned hard mask layer 130 as an etching mask. Then, the mask pattern 135 is removed as shown in FIG. 9E.

Subsequently, the patterned hard mask layer 130 is removed as shown in FIG. 9F by wet and/or dry etching. After the gate dielectric layers 82 and 82B are separated as shown in FIG. 9F, the WFM layer 89 is formed and the WFM layer 100 is formed over the WFM layer 89 to fill the gap between the high-k gate dielectric layer 82 and the dipole element doped high-k dielectric layer 82B, as shown in FIG. 9G. Further, similar to FIGS. 8H and 8J, a glue layer 87 and the body metal layer 88 are formed.

FIGS. 10A-10E show cross sectional views of various stages of manufacturing the semiconductor device according to embodiments of the present disclosure. It is understood that in the sequential manufacturing process, one or more additional operations can be provided before, during, and after the stages shown in FIGS. 10A-10E and some of the operations described below can be replaced or eliminated for additional embodiments of the method. The order of the operations/processes may be interchangeable. Materials, configurations, dimensions, processes and/or operations as described with respect to embodiments of FIGS. 1A-9G can be employed in the following embodiments, and detailed description thereof may be omitted.

Figure 10D:
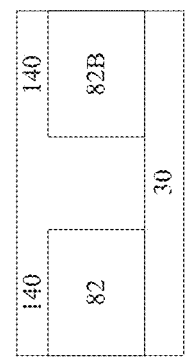
FIGS. 10A, 10B, 10C, 10D and 10E show cross sectional views of various stages of a sequential manufacturing process of a semiconductor device according to embodiments of the present disclosure.
Figure 10E:
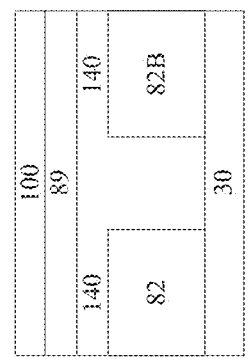
Figure 10A:
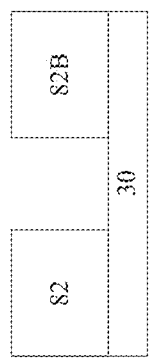
Figure 10B:
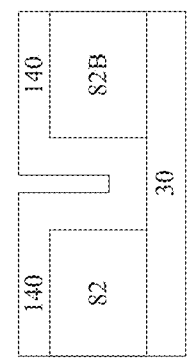

FIG. 10A shows the structure formed in FIG. 8F. Then, as shown in FIG. 10B, the another dielectric layer 140 is conformally formed to partially fill the gap between the high-k dielectric layer 82 and the dipole element doped high-k dielectric layer 82B. Then, as shown in FIG. 10C, the WFM layer 89 is formed over the another dielectric layer 140, and the WFM layer 100 is formed over the WFM layer 89.

In other embodiments, the another dielectric layer 140 is formed to fully fill the gap between the high-k dielectric layer 82 and the dipole element doped high-k dielectric layer 82B, as shown in FIG. 10D. Then, as shown in FIG. 10E, the WFM layer 89 is formed over the another dielectric layer 140, and the WFM layer 100 is formed over the WFM layer 89.

Figure 10C:
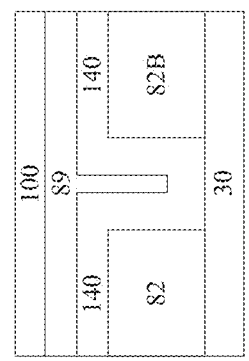

In the embodiments of FIGS. 10C and 10E, at least the another dielectric layer 140 functions as a barrier layer to suppress diffusion of the dipole elements.

Figure 11C:
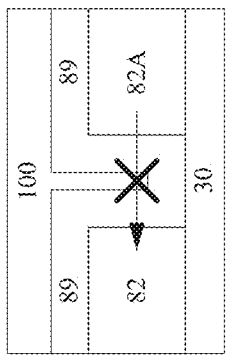
Figure 11F:
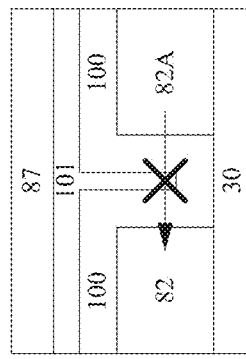
Figure 11I:
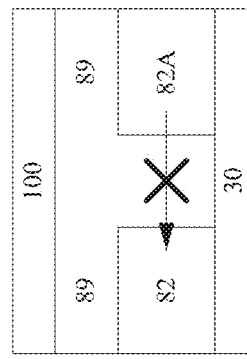
Figure 11B:
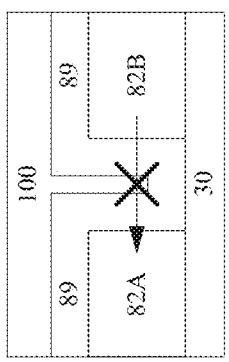
Figure 11E:
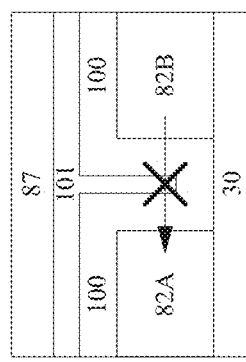
Figure 11H:
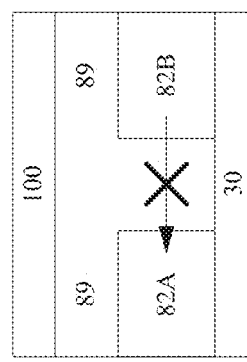
Figure 11A:
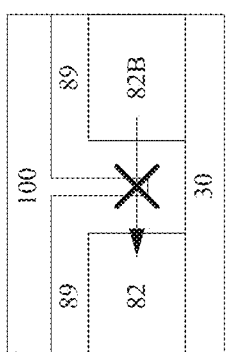

FIGS. 11A-11V show various boundary configurations between different Vt devices according to embodiments of the present disclosure. Materials, configurations, dimensions, processes and/or operations as described with respect to embodiments of FIGS. 1A-10E can be employed in the following embodiments, and detailed description thereof may be omitted.

Figure 11D:
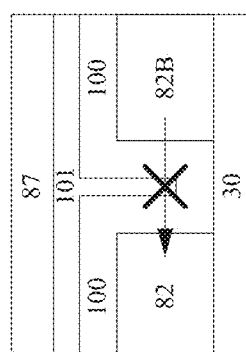
Figure 11G:
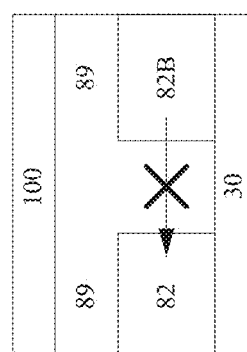

As shown in FIGS. 11A-11C, diffusion of the dipole element (e.g., La) from the higher doping concentration to the lower or zero concentration region can be suppressed by the WFM layer 89 and the WFM layer 100. In FIGS. 11D-11F, diffusion of the dipole element from the higher doping concentration to the lower or zero concentration region can be suppressed by the WFM layer 100 and the cap layer 101. In FIGS. 11G-11I, diffusion of the dipole element from the higher doping concentration to the lower or zero concentration region can be suppressed by the WFM layer 89.

Figure 11J:
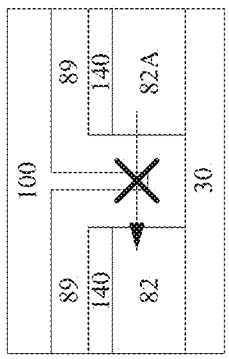
Figure 11M:
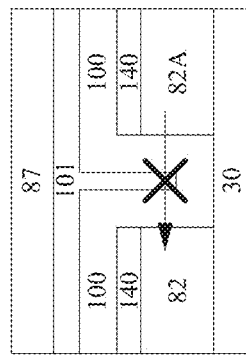
Figure 11P:
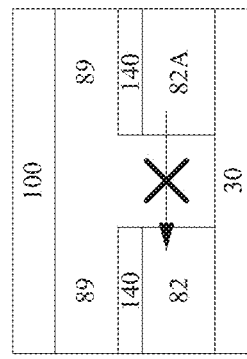
Figure 11K:
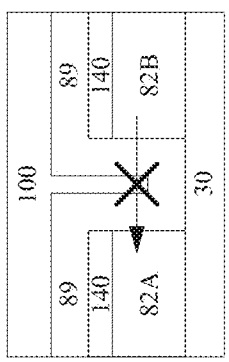
Figure 11N:
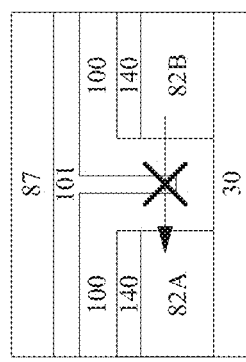
Figure 11Q:
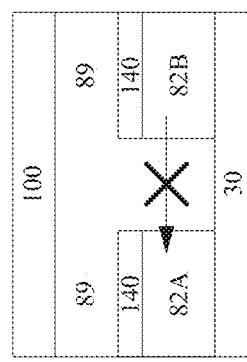
Figure 11L:
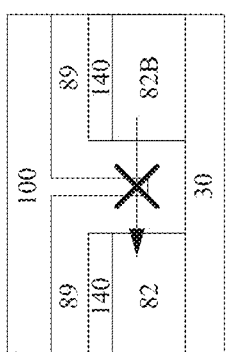
Figure 11O:
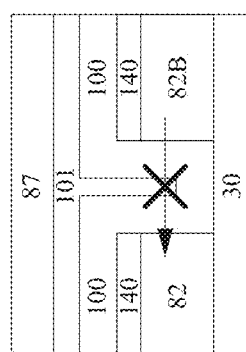
Figure 11R:
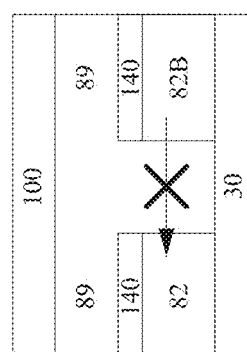

In FIGS. 11J-11L, diffusion of the dipole element (e.g., La) from the higher doping concentration to the lower or zero concentration region can be suppressed by the WFM layer 89 and the WFM layer 100. In FIGS. 11M-11O, diffusion of the dipole element from the higher doping concentration to the lower or zero concentration region can be suppressed by the WFM layer 100 and the cap layer 101. In FIGS. 11P-11R, diffusion of the dipole element from the higher doping concentration to the lower or zero concentration region can be suppressed by the WFM layer 89.

In FIGS. 11S, 11T, 11U and 11V, diffusion of the dipole element from the higher doping concentration to the lower or zero concentration region can be suppressed by the WFM layer 89 and the WFM layer 100.

In some embodiments, the trench 76 does not necessarily cut the boundary of different gate dielectric layers. As shown in FIG. 11W, the trench cuts the lower dipole concentration dielectric layer (e.g., 82A, 82B), and the WFM barrier is formed in the trench.

Figure 12:
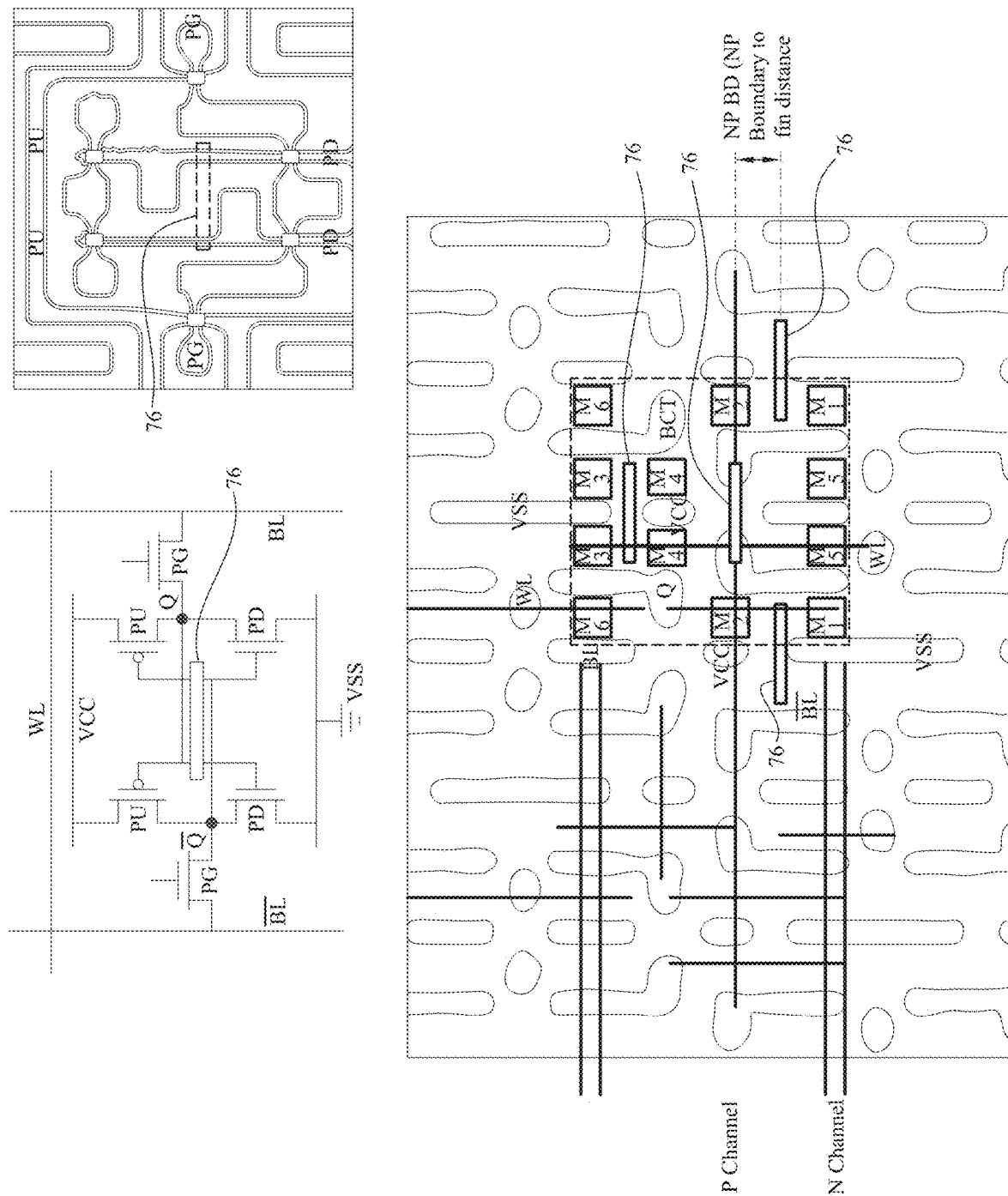
FIG. 12 shows a static random access memory (SRAM) layout according to embodiments of the present disclosure.

FIG. 12 shows an SRAM circuit layout according to embodiments of the present disclosure. In some embodiments, an SRAM unit cell includes six transistors (two pass-gate transistors (PGs), pull-up transistors (PUs) and pull-down transistors (PDs)), and the PD and PU are different conductivity, and thus, use different gate dielectric material in terms of dipole doping, and share the same gate electrode. In some embodiments, a boundary of the as formed gate dielectric layer is cut between the p-type FET and n-type FET as set forth above. In some embodiments, one trench 76 is formed over two gate spaces each of the PD and PU.

Figure 13:
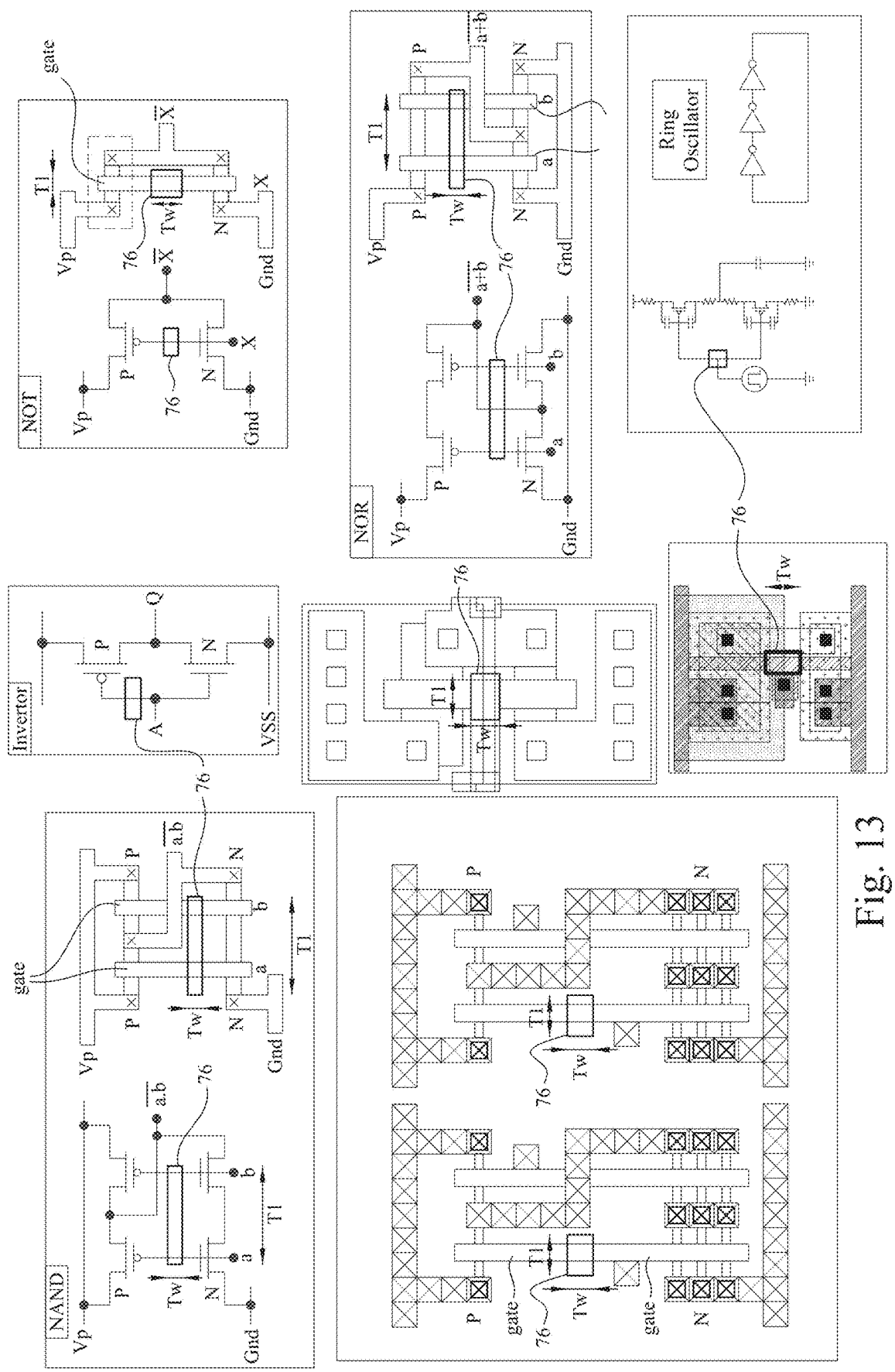
FIG. 13 shows various circuit layouts according to embodiments of the present disclosure.

FIG. 13 show various circuit layouts where the present embodiments are applied. In some embodiments, a gate electrode is shared by a p-type FET and an n-type FET having different gate dielectric material in terms of dipole doping, a trench 76 is formed over the gate space at or around the boundary of the p-type FET and n-type FET. However, when a gate electrode is shared by a p-type FET and an n-type FET having the same gate dielectric material in terms of dipole doping, no trench 76 is necessary.

In the present disclosure, in a gate electrode disposed over and shared by a p-type FET and an n-type FET, gate dielectric layers having different dipole element (La, Sc, Sr, Ce, Y, Dy, Eu, Yb, Al, Lu, Nb, W, Mo, V etc.) doping concentration are separated from each other by a barrier layer to suppress dipole element diffusion. The barrier layer can be one or more WFM layers (e.g., TiAl, TiAlC, TaAl, TaAlC, TiN, TiSiN, Ru, WN, WCN, MoN, etc.), another dielectric layer (hafnium oxide, zirconium oxide, aluminum oxide, etc.) or any layers constituting the gate electrode (e.g., TaN, W, etc.). By suppressing the dipole element diffusion, it is possible to suppress Vt shift or any other degradation of device performances which would be otherwise caused by the dipole element diffusion.

It will be understood that not all advantages have been necessarily discussed herein, no particular advantage is required for all embodiments or examples, and other embodiments or examples may offer different advantages.

In accordance with one aspect of the present application, a semiconductor device includes a first field effect transistor (FET) including a first gate structure disposed over a first channel region, and a second FET having different conductivity type than the first FET and including a second gate structure disposed over a second channel region. The first gate structure includes a first gate dielectric layer over the first channel region, a first work function adjustment material (WFM) layer over the first gate dielectric layer, and a first metal gate electrode layer. The second gate structure includes a second gate dielectric layer over the second channel region, a second WFM layer over the second gate dielectric layer, and a second metal gate electrode layer. The first metal gate electrode layer and the second metal gate electrode layer are continuously formed and made of a same material. The first gate dielectric layer is separated from the second gate dielectric layer by a gap. At least one of the first gate dielectric layer or the second gate dielectric layer includes a dopant, and a dopant concentration is different between the first gate dielectric layer and the second gate dielectric layer. In one or more of the foregoing and following embodiments, the dopant is at least one selected from the group consisting of La, Sc, Sr, Ce, Y, Dy, Eu Pb, Tr, Nd, Gd, Pm, Pr, Ho, Er, Tm, Sm, Yb, Al, Nb, Mo, W, Ti, Hf, Zr, Ta, V, Ba and Mg. In one or more of the foregoing and following embodiments, the first and second gate dielectric layers include one selected from the group consisting of hafnium oxide, zirconium oxide and hafnium-zirconium oxide. In one or more of the foregoing and following embodiments, the first WFM layer and the second WFM layer are continuously formed and made of a same material. In one or more of the foregoing and following embodiments, the gap is filled by a part of the first or second WFM layers. In one or more of the foregoing and following embodiments, first and second WFM layers include at least one layer of one material selected from the group consisting of TiN, TiSiN, WN, WCN, MoN and Ru. In one or more of the foregoing and following embodiments, first and second WFM layers include at least one layer of one material selected from the group consisting of TaAl, TaAlC, TiAl or TiAlC. In one or more of the foregoing and following embodiments, a width of the gap along a gate extension direction is in a range from 14 nm to 120 nm. In one or more of the foregoing and following embodiments, each of the first WFM layer and the second WFM layer comprises one or more layers made of different material, and a layer structure of the first WFM is different from a layer structure of the second WFM. In one or more of the foregoing and following embodiments, the gap is filled by a part of the first WFM layer and a part of the second WFM layer.

In accordance with another aspect of the present disclosure, a semiconductor device includes a first field effect transistor (FET) including a first gate structure disposed over a first channel region, and a second FET having different conductivity type than the first FET and including a second gate structure disposed over a second channel region. The first gate structure includes a first gate dielectric layer over the first channel region, a second gate dielectric layer disposed over the first gate dielectric layer, a first work function adjustment material (WFM) layer over the second gate dielectric layer, and a first metal gate electrode layer. The second gate structure includes a third gate dielectric layer over the second channel region, a fourth gate dielectric layer over the second channel region, a second WFM layer over the fourth gate dielectric layer, and a second metal gate electrode layer. The first metal gate electrode layer and the second metal gate electrode layer are continuously formed, and the first gate dielectric layer is separated from the second gate dielectric layer by a gap. In one or more of the foregoing and following embodiments, at least one of the first gate dielectric layer or the third gate dielectric layer includes a dopant, the dopant is at least one selected from the group consisting of La, Sc, Sr, Ce, Y, Dy, Eu and Yb, and a dopant concentration is different between the first gate dielectric layer and the second gate dielectric layer. In one or more of the foregoing and following embodiments, the second gate dielectric layer and the fourth gate dielectric layer are made of a same material. In one or more of the foregoing and following embodiments, the second gate dielectric layer is separated from the fourth gate dielectric layer by a gap. In one or more of the foregoing and following embodiments, the second gate dielectric layer and the fourth gate dielectric layer are continuously formed and at least partially fill the gap. In one or more of the foregoing and following embodiments, compositions of the first and third gate dielectric layer are different from a composition of the second and fourth gate dielectric layer.

In accordance with another aspect of the present disclosure, a gate structure of a field effect transistor includes a first gate dielectric layer, a second gate dielectric layer, and one or more conductive layers disposed over the first gate dielectric layer and the second gate dielectric layer. The first gate dielectric layer is separated from the second gate dielectric layer by a gap filled with a diffusion blocking layer. In one or more of the foregoing and following embodiments, the first and second gate dielectric layers include one selected from the group consisting of hafnium oxide, zirconium oxide and hafnium-zirconium oxide, at least one of the first and second gate dielectric layers includes La as a dopant, and a dopant concentration is different between the first gate dielectric layer and the second gate dielectric layer. In one or more of the foregoing and following embodiments, the first gate dielectric layer includes no dopant. In one or more of the foregoing and following embodiments, at least one layer of the one or more conductive layers is continuously disposed over the first gate dielectric layer and the second gate dielectric layer.

In accordance with another aspect of the present disclosure, in a method of manufacturing a semiconductor device, a gate dielectric layer is formed in a gate space, where the gate space is formed by one or more insulating layers. The gate dielectric layer is separated into a first gate dielectric layer and a second gate dielectric layer by forming a trench. One or more work function adjustment material (WFM) layers are formed over the first gate dielectric layer and the second gate dielectric layer. A body gate electrode layer is formed over the one or more WFM layers. In one or more of the foregoing and following embodiments, the gate dielectric layer comprises a first region and a second region adjacent to the first region, at least one of the first region or the second region includes a dopant, a dopant concentration is different between the first region and the second region, and the first gate dielectric layer includes the first region and the second gate dielectric layer includes the second region. In one or more of the foregoing and following embodiments, the dopant is at least one selected from the group consisting of La, Sc, Sr, Ce, Y, Dy, Eu and Yb. In one or more of the foregoing and following embodiments, the gate dielectric layer includes one selected from the group consisting of hafnium oxide, zirconium oxide and hafnium-zirconium oxide. In one or more of the foregoing and following embodiments, the trench is filled by a part of the one or more WFM layers. In one or more of the foregoing and following embodiments, the gate dielectric layer is separated by the following operations. A hard mask layer is formed over the gate dielectric layer, a mask pattern having an opening is formed over the hard mask layer, the hard mask layer is patterned by using the mask pattern as an etching mask, the gate dielectric layer is patterned by using at least one of the mask pattern or the patterned hard mask layer as an etching mask, and the mask pattern and the patterned hard mask layer are removed. In one or more of the foregoing and following embodiments, the hard mask layer is made of a different material than the gate dielectric layer and includes at least one selected from the group consisting of one or more of aluminum oxide, aluminum nitride, aluminum oxynitride, titanium oxide and titanium oxynitride. In one or more of the foregoing and following embodiments, a thickness of the hard mask layer is in a range from 0.5 nm to 20 nm. In one or more of the foregoing and following embodiments, the mask pattern is made of an organic antireflective coating material.

In accordance with another aspect of the present disclosure, in a method of manufacturing a semiconductor device, a first gate dielectric layer is formed over a first channel region made of a first semiconductor material and over an isolation insulating layer, a second gate dielectric layer is formed over a second channel region made of a second semiconductor material and over the isolation insulating layer. The first gate dielectric layer is laterally in contact with the second gate dielectric layer at a boundary located over the isolation insulating layer. By using a patterning operation, the first gate dielectric layer and the second gate dielectric layer are separated by a trench. A diffusion barrier is formed by filling the trench with a dielectric material or a conductive material. At least one of the first gate dielectric layer or the second gate dielectric layer includes a dopant, a dopant concentration is different between the first gate dielectric layer and the second gate dielectric layer, and the diffusion barrier functions as a barrier for the dopant. In one or more of the foregoing and following embodiments, the first and second gate dielectric layer includes one selected from the group consisting of hafnium oxide, zirconium oxide and hafnium-zirconium oxide. In one or more of the foregoing and following embodiments, the dopant is at least one selected from the group consisting of La, Sc, Sr, Ce, Y, Dy, Eu and Yb. In one or more of the foregoing and following embodiments, in the separating the first gate dielectric layer and the second gate dielectric layer, a hard mask layer is formed over the first and second gate dielectric layers. A mask pattern having an opening is formed over the hard mask layer and above the boundary. The hard mask layer is patterned by using the mask pattern as an etching mask. The first and second gate dielectric layers are patterned by using at least one of the mask pattern or the patterned hard mask layer as an etching mask. The mask pattern and the patterned hard mask layer are removed. In one or more of the foregoing and following embodiments, the hard mask layer includes at least one selected from the group consisting of one or more of aluminum oxide, aluminum nitride, aluminum oxynitride, titanium oxide and titanium oxynitride. In one or more of the foregoing and following embodiments, a width of the trench is in a range from 10 nm to 150 nm. In one or more of the foregoing and following embodiments, the diffusion barrier includes at least one layer of TiAl, TiAlC, TaAl, TaAlC, TiN, TiSiN, Ru, WN, WCN, MoN or TaN. In one or more of the foregoing and following embodiments, the diffusion barrier includes at least one selected from the group consisting of one or more of aluminum oxide, aluminum nitride, aluminum oxynitride, titanium oxide and titanium oxynitride, and does not includes the dopant or includes a lower amount of the dopant than at least one of the first gate dielectric layer or the second gate dielectric layer.

In accordance with another aspect of the present disclosure, in a method of manufacturing a semiconductor device, a first gate dielectric layer is formed over a first channel region made of a first semiconductor material and over an isolation insulating layer. A second gate dielectric layer is formed over a second channel region made of a second semiconductor material and over the isolation insulating layer. The first gate dielectric layer is laterally in contact with the second gate dielectric layer at a boundary located over the isolation insulating layer. A third gate dielectric layer is formed over the first and second gate dielectric layers. By using a patterning operation, the first gate dielectric layer and the second gate dielectric layer are separated by a trench. One or more work function adjustment material (WFM) layers are formed over the third gate dielectric layer on the first gate dielectric layer and over the third gate dielectric layer on the second gate dielectric layer. A body gate electrode layer is formed over the one or more WFM layers. A part of the one or more WFM layers fills the trench. In one or more of the foregoing and following embodiments, at least one of the first gate dielectric layer or the second gate dielectric layer includes a dopant, a dopant concentration is different between the first gate dielectric layer and the second gate dielectric layer, and the dopant is at least one selected from the group consisting of La, Sc, Sr, Ce, Y, Dy, Eu and Yb. In one or more of the foregoing and following embodiments, the first, second and third gate dielectric layers each includes one selected from the group consisting of one or more of aluminum oxide, aluminum nitride, aluminum oxynitride, titanium oxide and titanium oxynitride.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a first gate dielectric layer in a gate space, the gate space being laterally surrounded by one or more insulating layers;
    forming a second gate dielectric layer over the first gate dielectric layer;
    separating the first and second gate dielectric layers into a first stacked gate dielectric layer and a second stacked gate dielectric layer by forming a trench;
    forming one or more work function adjustment material (WFM) layers over the first stacked gate dielectric layer and the second stacked gate dielectric layer; and
    forming a body gate electrode layer over the one or more WFM layers,
    wherein the trench is filled by a part of the one or more WFM layers.

2. The method of claim 1, wherein:
    the first gate dielectric layer comprises a first region and a second region adjacent to the first region,
    at least one of the first region or the second region includes a dopant,
    a dopant concentration is different in the first region than the second region, and
    the first stacked gate dielectric layer includes the first region and the second stacked gate dielectric layer includes the second region.

3. The method of claim 2, wherein the dopant is at least one selected from the group consisting of La, Sc, Sr, Ce, Y, Dy, Eu, Pb, Tr, Nd, Gd, Pm, Pr, Ho, Er, Tm, Sm, Yb, Al, Nb, Mo, W, Ti, Hf, Zr, Ta, V, Ba and Mg.

4. The method of claim 2, wherein the first and second gate dielectric layers include one selected from the group consisting of hafnium oxide, zirconium oxide and hafnium-zirconium oxide, respectively.

5. The method of claim 1, wherein the separating the first and second gate dielectric layers comprises:
    forming a hard mask layer over the second gate dielectric layer;
    forming a mask pattern having an opening over the hard mask layer;
    patterning the hard mask layer by using the mask pattern as an etching mask;
    patterning the second and first gate dielectric layers by using at least one of the mask pattern or the patterned hard mask layer as an etching mask; and
    removing the mask pattern and the patterned hard mask layer.

6. The method of claim 5, wherein the hard mask layer is made of a different material than the first and second gate dielectric layers and includes at least one selected from the group consisting of aluminum oxide, aluminum nitride, aluminum oxynitride, titanium oxide, titanium oxynitride, titanium nitride, and tantalum oxynitride.

7. The method of claim 6, wherein a thickness of the hard mask layer is in a range from 0.5 nm to 20 nm.

8. The method of claim 5, wherein the mask pattern is made of an organic antireflective coating material.

9. A method of manufacturing a semiconductor device, comprising:
- forming a first gate dielectric layer over a first channel region made of a first semiconductor material and over an isolation insulating layer;
- forming a second gate dielectric layer over a second channel region made of a second semiconductor material and over the isolation insulating layer, the first gate dielectric layer being laterally in contact with the second gate dielectric layer at a boundary located over the isolation insulating layer;
- forming a third gate dielectric layer over the first and second gate dielectric layers;
- separating, by using a patterning operation, the third gate dielectric layer, the first gate dielectric layer and the second gate dielectric layer by a trench; and
- forming a diffusion barrier by filling the trench with a dielectric material or a conductive material, wherein:
- at least one of the first gate dielectric layer or the second gate dielectric layer includes a dopant,
- a dopant concentration is different between the first gate dielectric layer and the second gate dielectric layer, and
- the third gate dielectric layer includes one selected from the group consisting of hafnium oxide, zirconium oxide, and hafnium-zirconium oxide.

10. The method of claim 9, wherein the first and second gate dielectric layers include hafnium oxide.

11. The method of claim 10, wherein the dopant is at least one selected from the group consisting of La, Sc, Sr, Ce, Y, Dy, Eu and Yb.

12. The method of claim 9, wherein the third gate dielectric layer is made of a different material than the first and second gate dielectric layers.

13. The method of claim 9, wherein a width of the trench is in a range from 10 nm to 150 nm.

14. The method of claim 9, wherein the diffusion barrier includes at least one layer of TiAl, TiAlC, TaAl, TaAlC, TiN, TiSiN, Ru, WN, WCN, MON or TaN.

15. A method of manufacturing a semiconductor device, comprising:
- forming a pair of first gate spaces and a pair of second gate spaces;
- forming a first gate dielectric layer in the pair of first gate spaces and a second gate dielectric layer in the pair of second gate spaces;
- forming a third gate dielectric layer over the first and second gate dielectric layers,
- wherein the third gate dielectric layer includes one selected from the group consisting of hafnium oxide, zirconium oxide, and hafnium-zirconium oxide;
- separating, by using a patterning operation, the third gate dielectric layer the first gate dielectric layer and the second gate dielectric layer by a trench that connects the pair of first gate spaces and the pair of second gate spaces; and
- forming one or more work function adjustment material (WFM) layers over the third gate dielectric layer in the pair of first gate spaces and over the third gate dielectric layer in the pair of second gate spaces; and
- forming a body gate electrode layer over the one or more WFM layers,
- wherein a part of the one or more WFM layers fills the trench.

16. The method of claim 15, wherein:
- at least one of the first gate dielectric layer or the second gate dielectric layer includes a dopant, and
- a dopant concentration is different between the first gate dielectric layer and the second gate dielectric layer.

17. The method of claim 16 wherein the dopant is at least one selected from the group consisting of La, Sc, Sr, Ce, Y, Dy, Eu and Yb.

18. The method of claim 17, wherein the first and second and gate dielectric layers each include one selected from the group consisting of one or more of aluminum oxide, aluminum nitride, aluminum oxynitride, titanium oxide and titanium oxynitride.

19. The method of claim 15, wherein the third gate dielectric layer is made of a different material than the first and second gate dielectric layers.

20. The method of claim 15, wherein a width of the trench is in a range from 10 nm to 150 nm.

* * * * *